US008080833B2

(12) United States Patent
Grandusky et al.

(10) Patent No.: US 8,080,833 B2
(45) Date of Patent: Dec. 20, 2011

(54) THICK PSEUDOMORPHIC NITRIDE EPITAXIAL LAYERS

(75) Inventors: James R. Grandusky, Waterford, NY (US); Leo J. Schowalter, Latham, NY (US); Shawn R. Gibb, Clifton Park, NY (US); Joseph A. Smart, Mooresville, NC (US); Shiwen Liu, Painted Post, NY (US)

(73) Assignee: Crystal IS, Inc., Green Island, NY (US)

( * ) Notice: Subject to any disclaimer, the term of this patent is extended or adjusted under 35 U.S.C. 154(b) by 0 days.

(21) Appl. No.: 12/764,584

(22) Filed: Apr. 21, 2010

(65) Prior Publication Data

US 2010/0264460 A1 Oct. 21, 2010

Related U.S. Application Data

(63) Continuation-in-part of application No. 12/020,006, filed on Jan. 25, 2008.

(60) Provisional application No. 60/897,572, filed on Jan. 26, 2007, provisional application No. 61/252,408, filed on Oct. 16, 2009.

(51) Int. Cl.
*H01L 33/00* (2010.01)

(52) U.S. Cl. ............ 257/190; 257/13; 257/94; 257/103; 257/E33.028; 257/E33.067; 438/47

(58) Field of Classification Search .................. 257/190, 257/94
See application file for complete search history.

(56) References Cited

U.S. PATENT DOCUMENTS

| 3,531,245 A | 9/1970 | Dietz |
| 3,600,701 A | 8/1971 | Gouldthorpe |
| 3,603,414 A | 9/1971 | Stebley |
| 3,607,014 A | 9/1971 | Huml et al. |
| 3,634,149 A | 1/1972 | Knippenberg et al. |
| 3,768,983 A | 10/1973 | Elkins et al. |
| 3,903,357 A | 9/1975 | Woolfson et al. |
| 3,933,573 A | 1/1976 | Dugger |
| 4,008,851 A | 2/1977 | Hirsch |
| 4,088,515 A | 5/1978 | Blakeslee et al. |
| 4,234,554 A | 11/1980 | Rabenau et al. |
| 4,547,471 A | 10/1985 | Huseby et al. |
| 5,070,393 A | 12/1991 | Nakagawa et al. |
| 5,087,949 A | 2/1992 | Haitz |
| 5,292,487 A | 3/1994 | Tatsumi et al. |
| 5,312,698 A | 5/1994 | Sato et al. |

(Continued)

FOREIGN PATENT DOCUMENTS

DE 102 48 964 4/2004

(Continued)

OTHER PUBLICATIONS

Gaska et al, Applied Physics Letters vol. 81, No. 24 Dec. 9, 2002 "Deep-ultraviolet . . . AlN" pp. 4658-4660.*

(Continued)

*Primary Examiner* — Jerome Jackson, Jr.
(74) *Attorney, Agent, or Firm* — Bingham McCutchen LLP

(57) ABSTRACT

In various embodiments, a semiconductor device includes an aluminum nitride single-crystal substrate, a pseudomorphic strained layer disposed thereover that comprises at least one of AlN, GaN, InN, or an alloy thereof, and, disposed over the strained layer, a semiconductor layer that is lattice-mismatched to the substrate and substantially relaxed.

20 Claims, 8 Drawing Sheets

U.S. PATENT DOCUMENTS

| | | | |
|---|---|---|---|
| 5,494,861 A | 2/1996 | Yamaga et al. | |
| 5,520,785 A | 5/1996 | Evans et al. | |
| 5,525,320 A | 6/1996 | Pratsinis et al. | |
| 5,571,603 A | 11/1996 | Utumi et al. | |
| 5,670,798 A * | 9/1997 | Schetzina | 257/96 |
| 5,703,397 A | 12/1997 | Endo et al. | |
| 5,728,635 A | 3/1998 | Kobayashi et al. | |
| 5,858,085 A | 1/1999 | Arai et al. | |
| 5,858,086 A | 1/1999 | Hunter | |
| 5,868,837 A | 2/1999 | DiSalvo et al. | |
| 5,909,036 A | 6/1999 | Tanaka et al. | |
| 5,924,874 A | 7/1999 | Gotoh et al. | |
| 5,954,874 A | 9/1999 | Hunter | |
| 5,972,109 A | 10/1999 | Hunter | |
| 5,981,980 A | 11/1999 | Miyajima et al. | |
| 6,000,174 A | 12/1999 | Yamazaki et al. | |
| 6,001,748 A | 12/1999 | Tanaka et al. | |
| 6,006,620 A | 12/1999 | Lawrie et al. | |
| 6,045,612 A | 4/2000 | Hunter | |
| 6,048,813 A | 4/2000 | Hunter | |
| 6,063,185 A | 5/2000 | Hunter | |
| 6,066,205 A | 5/2000 | Hunter | |
| 6,086,672 A | 7/2000 | Hunter | |
| 6,091,085 A | 7/2000 | Lester | |
| 6,187,089 B1 | 2/2001 | Phillips et al. | |
| 6,211,089 B1 | 4/2001 | Kim et al. | |
| 6,270,569 B1 | 8/2001 | Shibata et al. | |
| 6,296,956 B1 | 10/2001 | Hunter | |
| 6,398,867 B1 | 6/2002 | D'Evelyn et al. | |
| 6,404,125 B1 | 6/2002 | Garbuzov et al. | |
| 6,447,604 B1 | 9/2002 | Flynn et al. | |
| 6,468,347 B1 | 10/2002 | Motoki et al. | |
| 6,515,308 B1 | 2/2003 | Kneissl et al. | |
| 6,548,405 B2 | 4/2003 | Kraus et al. | |
| 6,592,663 B1 | 7/2003 | Sarayama et al. | |
| 6,596,079 B1 | 7/2003 | Vaudo et al. | |
| 6,719,843 B2 | 4/2004 | Schowalter et al. | |
| 6,770,135 B2 | 8/2004 | Schowalter et al. | |
| 6,777,717 B1 | 8/2004 | Karlicek | |
| 6,791,119 B2 | 9/2004 | Slater, Jr. et al. | |
| 6,831,302 B2 | 12/2004 | Erchak | |
| 6,840,431 B1 | 1/2005 | Kim | |
| 6,861,729 B2 | 3/2005 | Kozaki et al. | |
| 6,936,357 B2 | 8/2005 | Melnik et al. | |
| 6,995,402 B2 | 2/2006 | Ludowise et al. | |
| 7,026,659 B2 | 4/2006 | Slater, Jr. et al. | |
| 7,037,738 B2 * | 5/2006 | Sugiyama et al. | 438/29 |
| 7,037,838 B2 | 5/2006 | Schowalter et al. | |
| 7,056,383 B2 | 6/2006 | Helava et al. | |
| 7,063,741 B2 | 6/2006 | D'Evelyn et al. | |
| 7,087,112 B1 | 8/2006 | Rojo et al. | |
| 7,125,734 B2 | 10/2006 | Sackrison | |
| 7,186,580 B2 | 3/2007 | Tran et al. | |
| 7,211,146 B2 | 5/2007 | Schowalter et al. | |
| 7,211,831 B2 | 5/2007 | Erchak et al. | |
| 7,244,520 B2 | 7/2007 | Kumakura et al. | |
| 7,250,637 B2 | 7/2007 | Shimizu | |
| 7,274,043 B2 | 9/2007 | Erchak et al. | |
| 7,276,779 B2 | 10/2007 | Shibata | |
| 7,288,152 B2 | 10/2007 | Kitaoka et al. | |
| 7,420,218 B2 | 9/2008 | Nagai | |
| 7,420,222 B2 | 9/2008 | Slater, Jr. et al. | |
| 7,439,552 B2 | 10/2008 | Takigawa et al. | |
| 7,476,910 B2 * | 1/2009 | Fujimoto et al. | 257/95 |
| 7,518,158 B2 | 4/2009 | Keller et al. | |
| 7,524,376 B2 | 4/2009 | Wang | |
| 7,554,128 B2 | 6/2009 | Okamoto et al. | |
| 7,631,986 B2 | 12/2009 | Harrah | |
| 7,638,346 B2 | 12/2009 | Schowalter et al. | |
| 7,641,735 B2 | 1/2010 | Slack et al. | |
| 7,674,699 B2 | 3/2010 | Shibata | |
| 7,678,195 B2 | 3/2010 | Schlesser et al. | |
| 7,713,844 B2 | 5/2010 | Nishiura et al. | |
| 7,755,103 B2 | 7/2010 | Ueno | |
| 7,776,153 B2 | 8/2010 | Schowalter | |
| 7,803,733 B2 | 9/2010 | Teratani et al. | |
| 2001/0000209 A1 | 4/2001 | Krames et al. | |
| 2001/0024871 A1 | 9/2001 | Yagi | |
| 2001/0051433 A1 | 12/2001 | Francis et al. | |
| 2002/0170490 A1 | 11/2002 | Vodakov et al. | |
| 2003/0047816 A1 | 3/2003 | Dutta | |
| 2003/0160254 A1 | 8/2003 | Henrichs | |
| 2003/0168003 A1 | 9/2003 | Schowalter et al. | |
| 2003/0213964 A1 | 11/2003 | Flynn | |
| 2003/0216011 A1 | 11/2003 | Nakamura et al. | |
| 2004/0130002 A1 | 7/2004 | Weeks et al. | |
| 2004/0187766 A1 | 9/2004 | Letertre | |
| 2004/0206978 A1 | 10/2004 | Saxler | |
| 2004/0213309 A9 | 10/2004 | Amano et al. | |
| 2004/0224484 A1 | 11/2004 | Fareed et al. | |
| 2004/0226917 A1 | 11/2004 | Laconto et al. | |
| 2004/0245535 A1 | 12/2004 | D'Evelyn et al. | |
| 2005/0062392 A1 | 3/2005 | Sakai et al. | |
| 2005/0072986 A1 | 4/2005 | Sasaoka | |
| 2005/0103257 A1 | 5/2005 | Xu et al. | |
| 2005/0142391 A1 | 6/2005 | Dmitriev et al. | |
| 2005/0161697 A1 | 7/2005 | Nakahata et al. | |
| 2005/0214992 A1 | 9/2005 | Chakraborty et al. | |
| 2005/0269577 A1 | 12/2005 | Ueda et al. | |
| 2005/0277214 A1 | 12/2005 | Uematsu et al. | |
| 2005/0285141 A1 | 12/2005 | Piner et al. | |
| 2006/0005763 A1 | 1/2006 | Schowalter et al. | |
| 2006/0029832 A1 | 2/2006 | Xu et al. | |
| 2006/0054075 A1 | 3/2006 | Dwilinski et al. | |
| 2006/0244011 A1 | 11/2006 | Saxler | |
| 2006/0255341 A1 | 11/2006 | Pinnington et al. | |
| 2006/0281205 A1 | 12/2006 | Park | |
| 2006/0288929 A1 | 12/2006 | Slack et al. | |
| 2007/0018184 A1 | 1/2007 | Beeson et al. | |
| 2007/0101932 A1 | 5/2007 | Schowalter et al. | |
| 2007/0102721 A1 | 5/2007 | Denbaars et al. | |
| 2007/0131160 A1 | 6/2007 | Slack et al. | |
| 2007/0134827 A1 | 6/2007 | Bondokov et al. | |
| 2007/0243653 A1 | 10/2007 | Morgan et al. | |
| 2007/0257333 A1 | 11/2007 | Schlesser et al. | |
| 2008/0012034 A1 | 1/2008 | Thielen et al. | |
| 2008/0036038 A1 | 2/2008 | Hersee et al. | |
| 2008/0054280 A1 | 3/2008 | Reginelli et al. | |
| 2008/0121910 A1 | 5/2008 | Bergmann et al. | |
| 2008/0135861 A1 | 6/2008 | Pokrovskiy et al. | |
| 2008/0142817 A1 | 6/2008 | Ibbetson et al. | |
| 2008/0144688 A1 | 6/2008 | Chua et al. | |
| 2008/0149945 A1 | 6/2008 | Nagai | |
| 2008/0149960 A1 | 6/2008 | Amo et al. | |
| 2008/0157111 A1 | 7/2008 | Erchak et al. | |
| 2008/0173887 A1 | 7/2008 | Baba et al. | |
| 2008/0182092 A1 | 7/2008 | Bondokov et al. | |
| 2008/0187016 A1 | 8/2008 | Schowalter et al. | |
| 2008/0191225 A1 | 8/2008 | Medendorp | |
| 2008/0251808 A1 | 10/2008 | Kususe et al. | |
| 2008/0258165 A1 | 10/2008 | Zimmerman et al. | |
| 2009/0008654 A1 | 1/2009 | Nagai | |
| 2009/0014742 A1 | 1/2009 | Erchak | |
| 2009/0039373 A1 | 2/2009 | Saito et al. | |
| 2009/0050050 A1 | 2/2009 | Slack et al. | |
| 2009/0065791 A1 | 3/2009 | Yen et al. | |
| 2009/0078957 A1 | 3/2009 | Hoshina | |
| 2009/0121246 A1 | 5/2009 | Denbaars et al. | |
| 2009/0121250 A1 | 5/2009 | Denbaars et al. | |
| 2009/0140279 A1 | 6/2009 | Zimmerman et al. | |
| 2009/0141502 A1 | 6/2009 | Sonoda et al. | |
| 2009/0155989 A1 | 6/2009 | Uematsu et al. | |
| 2009/0159910 A1 | 6/2009 | Lin et al. | |
| 2009/0166657 A1 | 7/2009 | Yamada et al. | |
| 2009/0173958 A1 | 7/2009 | Chakraborty et al. | |
| 2009/0233394 A1 | 9/2009 | Batres et al. | |
| 2009/0239357 A1 | 9/2009 | Amano et al. | |
| 2009/0256163 A1 | 10/2009 | Chakraborty | |
| 2009/0261372 A1 | 10/2009 | Ueda | |
| 2009/0267098 A1 | 10/2009 | Choi | |
| 2009/0278148 A1 | 11/2009 | Nabekura et al. | |
| 2009/0315054 A1 | 12/2009 | Kim et al. | |
| 2009/0321758 A1 | 12/2009 | Liu et al. | |
| 2009/0321771 A1 | 12/2009 | Hattori et al. | |
| 2010/0006870 A1 | 1/2010 | Lee et al. | |
| 2010/0012956 A1 | 1/2010 | Yoo et al. | |
| 2010/0025717 A1 | 2/2010 | Fujii et al. | |

| | | | |
|---|---|---|---|
| 2010/0025719 | A1 | 2/2010 | Li |
| 2010/0135349 | A1 | 6/2010 | Schowalter et al. |
| 2010/0187541 | A1 | 7/2010 | Slack et al. |
| 2010/0264460 | A1 | 10/2010 | Grandusky et al. |
| 2010/0314551 | A1 | 12/2010 | Bettles et al. |
| 2011/0008621 | A1 | 1/2011 | Morgan et al. |
| 2011/0011332 | A1 | 1/2011 | Rojo et al. |

FOREIGN PATENT DOCUMENTS

| | | |
|---|---|---|
| EP | 0 609 799 | 8/1994 |
| EP | 0 811 708 | 12/1997 |
| EP | 0 979 883 | 2/2000 |
| EP | 1 211 715 | 6/2002 |
| EP | 1 732 145 | 12/2006 |
| EP | 1 754 810 | 2/2007 |
| EP | 2 099 068 | 9/2009 |
| JP | 61/236686 | 10/1986 |
| JP | 02/018379 | 1/1990 |
| JP | 03/285075 | 12/1991 |
| JP | 4355920 | 12/1992 |
| JP | 00/154090 | 6/2000 |
| JP | 01/192647 | 7/2001 |
| JP | 06/169173 | 6/2006 |
| WO | WO-99/34037 | 7/1999 |
| WO | WO-00/22203 | 4/2000 |
| WO | WO-01/11116 | 2/2001 |
| WO | WO-03/007383 | 1/2003 |
| WO | WO-03/081730 | 10/2003 |
| WO | WO-2005/012602 | 2/2005 |
| WO | WO-2006/110512 | 10/2006 |
| WO | WO-2007/062250 | 5/2007 |
| WO | WO-2008/042020 | 4/2008 |

OTHER PUBLICATIONS

Arulkumaran et al., "Improved dc characteristics of AlGaN/GaN high-electron-mobility transistors on Aln/sapphire templates," (2002) *Applied Physics Letters*, vol. 81, No. 6, pp. 1131-1133.
Balkas et al., "Sublimation Growth and Characterizations of Bulk Aluminum Nitride Single Crystals," *J. Crystal Growth*, (1997) 179, p. 363.
Barin, *Thermochemical Data of Pure Substances, 2nd Ed.*, (1993) pp. 42, 1334-1335, 1337, 1381-1382, 1636-1639.
Bickermann et al., "Characterization of bulk AlN with low oxygen content," *Jrl. of Crys. Growth*, vol. 269, Nos. 2-4, pp. 432-442.
Bockowski et al., "Combustion Synthesis of Aluminum Nitride Under High Pressure of Nitrogen and Nitrogen-Argon Mixtures," *5 J. Mat. Synthesis & Processing 6*, (1997) pp. 449-458.
Bolgar et al., "Vaporization of the Nitirides of B, Al, and Ga," in *Khim Fiz. Nitrodov*, pp. 151-156 (1968) [Chem Abstr. 71, 34003j (1969)].
Chase et al., *J. Phys. Chem. Ref.* Data 14, Supplement No. 1 (1985).
Chase, *J. Phys. Chem.*, Ref. Data, Monograph No. 9, NIST-JANAF Thermochemical Tables, 4th Ed. (1998).
Chitnis et al., "Milliwatt Power AlGaN Quantum Well Deep Ultraviolet Light Emitting Diodes," *Phys. Sat. Sol. (a)*, (2003) vol. 200, No. 1, pp. 99-101.
Constantin et al., "Mixing rocksalt and wurtzite structure binary nitrides to form novel ternary alloys: ScGaN and MnGaN," *Mat. Res. Soc. Symp. Proc.*, 799 (2004) Z9.5.1.
Cox et al., "On the Preparation, Optical Properties and Electrical Behaviour of Aluminum Nitride," *J. Phys. Chem. Solids*, (1967) vol. 28, pp. 543-548.
Dalmau et al., Mat. Res. Soc. Proc., (2004) vol. 798, p. Y2.9.1.
DeVries et al., "Phase equilibria pertinent to the growth of cubic boron nitride," J. Cryst. Growth, 13/14 (1972) 88.
Dryburgh, "The Estimation of Maximum Growth Rate for Aluminum Nitride Crystals by Direct Sublimation," J. Crystal Growth, (1992) 125, pp. 65-68.
Dugger, "The single crystal synthesis and some properties of Aluminum Nitride", Air Force Cambridge Research Laboratories, Physical Science Research Papers, No. 656 (Aug. 1, 1975).
Dugger, The synthesis of Aluminum Nitride single crystals:, *Mat. Res. Bulletin*, 9 (1974) 331.
Epelbaum et al., "Sublimation growth of bulk AlN crystals: materials compatibility and crystal quality," *Mat. Sci. Forum*, (2002) 389-393, 1445.

Gorbatov et al., "Electrical Conductivity of Materials from Mixed Aluminum and Silicon Nitrides," *Sov. Powd. Met. Met. Ceram.*, (1970) vol. 9, pp. 917-920.
Hacke et al., "Photoluminescence Intensity and Spectral Distribution of GaN Films on SiC," (1999) *Phys. Stat. Sol. (b)*, 216, 639.
Hermann et al., "Highly Si-doped AlN Grown by Plasma-Assisted Molecular-Beam Epitaxy," *Applied Phys. Letters*, (2005) vol. 86, pp. 192108-1-192108-3.
Honig, "Vapor Pressure Data for the Solid and Liquid Elements", *RCA Review*, vol. 23 (1962).
International Search Report and Written Opinion for PCT/US2006/022329, mailed Dec. 12, 2006.
International Preliminary Report on Patentability and Written Opinion for PCT/US2006/045540, mailed Jun. 12, 2008.
International Preliminary Report on Patentability and Written Opinion for PCT/US2006/046300, mailed Jun. 12, 2006.
International Search Report and Written Opinion for PCT/US2007/011075, mailed Jul. 11, 2008.
International Search Report and Written Opinion for PCT/US2007/07980, mailed Oct. 12, 2007.
International Search Report and Written Opinion for PCT/US2008/000597, mailed May 20, 2008.
International Search Report and Written Opinion for PCT/US2008/001003, mailed Aug. 5, 2008.
International Search Report for PCT/US2006/045540, mailed Jul. 6, 2007.
International Search Report for PCT/US2006/046300, mailed May 30, 2007.
Jahnen et al., "Pinholes, Dislocations and Strain Relaxation in InGaN," *MRS Internet J. Nitride Semicond. Res.*, (1998) 3:39.
Kanechika et al., "n-type AlN Layer by Si Ion Implantation," *Applied Phys. Letters*, (2006) vol. 88, p. 202106.
Karel et al., "The luminescence properties of AlN with Manganese and rare earth activators under ultraviolet and cathode-ray excitation", *Czech. J. Phys.*, B20 (1970) 46.
Karpinski et al., "Equilibrium pressure of $N_2$ over GaN and high pressure solution growth of GaN", *J. Cryst. Growth*, 66 (1984) 1.
Karpov et al., "Sublimation Growth of AlN in Vacuum and in a Gas Atmosphere," *Phys. Stat. Sol. (a)*, (1999) 176, p. 435.
Kasu et al., "Formation of Solid Solution of Al1-xSixN (0<x?12%) Ternary Alloy," *Jap. J. Appl. Phys.*, (2001) vol. 40, Part 2, No. 10A, pp. L1048-L1050.
Kawabe et al., "Electrical and Optical Properties of AlN-a Thermostable Semiconductor," *Elec. Engin. In Japan*, (1967) vol. 87, pp. 62-70.
Kordis, "The BeO-MgO system", *J. Nuc. Mater.*, 14 (1964) 322.
Lawson et al., "Preparation of Single Crystals", Academic Press, New York (1958) pp. 18-20.
Liu et al., "A Global Growth Rate Model for Aluminum Nitride Sublimation," *J. Electrochemical Soc.*, (2002) 149, p. G12.
Liu et al., "Characterization of AlN Crystals Grown by Sublimation," *Phys. Stat. Sol. (a)*, (2001) 18, p. 769.
Liu et al., "Misfit Dislocation Generation in InGaN Epilayers on Free-Standing GaN," *Jap. J. Appl. Physics*, (2006) 46:22, pp. L549-L551.
Ludwig et al., "Dimers $[Al_2N_4]$", *Zeitsch. f. Naturforsch.*, B54 (1999) pp. 461-465.
Matthews et al., "Defects in Epitaxial Multilayers," *J. Crystal Growth*, (1974) 27, p. 118.
Mokhov et al., "Sublimation growth of AlN bulk crystals in Ta crucibles," *Jrl. of Crys. Growth*, (Jul. 15, 2005) vol. 281, No. 1, pp. 93-100.
Naidu et al., Eds. "Phase Diagrams of Binary Tungsten Alloys," Indian Institute of Metals, Calcutta, pp. 7-13 (1991).
Nakanishi et al., "Effects of Al Composition on luminescence properties of europim implanted $Al_xGa_{1-x}N$ ($0 \angle x \angle 1$)", *Phys. Stat. Sol. (c)*, 0 (2003) 2623.
Nassau et al., "The Physics and Chemistry of Color," Wiley-Interscience Publication (New York 1983).
Niewa et al., "$Li_3[ScN_2]$: The first nitridoscandate (III)—Tetrahedral Sc Coordination and unusual $MX_2$ framework", *Chem. Eur. J.* 9 (2003) 4255.

Niewa et al., "Recent developments in nitride chemistry", *Chem. Mater.*, 10 (1998) 2733.

Noveski et al., "Growth of AlN Crystals on AlN/SiC Seeds by AlN Powder Sublimation in Nitrogen Atmosphere," *MRS Internet J. Nitride Semicond. Res.*, (2004) 9, 2.

Noveski et al., "Mass Transfer in AlN Crystal Growth at High Temperatures," *J. Crystal Growth*, (2004) 264, pp. 369-378.

Office Action in Japanese Patent Application No. 2003-579324, May 27, 2008 (English Translation).

Sun et al., "Phase relationships in the system Y-Al-O-N", *Mater. Letters*, 3-4 (1991) 76.

Parker et al., "Determination of the critical layer thickness in the InGaN/GaN heterostructures," *Applied Phys. Letters.*, (1999) vol. 75, No. 18, pp. 2776-2778.

Proc. of NATO Advanced Study Inst. on Nitrogen Ceramics, University of Kent, Canterbury, U.K. (1976).

Raghothamachar et al., "Synchrotron White Beam Topography Characterization of Physical Vapor Transport Grown AlN and Ammonothermal GaN," *J. Crystal Growth*, (2002) 246, pp. 271-280.

Rojo et al., "Growth and Characterization of Epitaxial Layers on Aluminum Nitride Substrates Prepared from Bulk, Single Crystals," *J. Crystal Growth*, (2002) 240, p. 508.

Rojo et al., "Progress in the Preparation of Aluminum Nitride Substrates from Bulk Cystals," *Mat.Res. Soc. Symp. Pro.*, (2002) vol. 722, pp. 5-13.

Rojo et al., "Report on the Growth of Bulk Aluminum Nitride and Subsequent Substrate Preparation," *J. Crystal Growth*, (2001) 231, p. 317.

Schlesser et al., "Growth of AlN Bulk Crystals from the Vapor Phase," *Mat. Res. Soc. Symp. Proc.*, (2002) 693, p. I9.4.1.

Schlesser et al., "Seeded Growth of AlN Bulk Single Srystals by Sublimation," *J. Crystal Growth*, 241, pp. 416-420.

Schowalter et al., "Fabrication of Native, Single-Crystal AlN Substrates," *Phys. Stat. Sol. (c)*, (2003) 1-4.

Segal et al., "On Mechanisms of Sublimation Growth of AlN bulk Crystals," *J. Crystal Gowth*, (2000) 211, pp. 68-72.

Shih et al, "High-quality and crack-free $Al_xGa_{1-x}N$ (x-0.2) grown on sapphire by a two-step growth method," *Jrl. of Crys. Growth*, (Apr. 15, 2005) vol. 277, No. 1-4, pp. 44-50.

Silveira et al., "Excitonic Structure of Bulk AlN from Optical Reflectivity and Cathodoluminescense Measurements," *Phys. Review* B71, 041201® (2006).

Singh et al., "Physical Vapor Transport Growth of Large AlN Crystals," *J. Cryst. Growth*, (2003) 250, p. 107.

Slack et al., "AlN Single Crystals," *J. Crystal Growth*, (1977) 42, pp. 560-563.

Slack et al., "Growth of High Purity AlN Crystals," *Journal of Crystal Growth*, (1976) vol. 34, pp. 263-279.

Slack et al., "Properties of Crucible Materials for Bulk Growth of AlN," *Mat. Res. Soc. Proc.*, (2004) vol. 798, pp. Y10.74.1-Y10.74.4.

Slack et al., "Some Effects of Oxygen Impurities on AlN and GaN," *J. Crystal Growth*, (2002) 246, pp. 287-298.

Smart et al., "AlGaN/GaN Heterostructures on Insulating AlGaN Nucleation Layers," *Appl. Phys. Letters*, (1999) 75, p. 388.

Solid State Lighting Report (Dept. of Energy, 2007).

Song, "Strain relaxation due to V-pit formation in $In_xGa_{1-x}N$/GaN epilayers grown on sapphire," *J. Applied Phys.*, (2005) 98: 084906.

Takeuchi et al., "Optical Properties of Strained AlGaN and GaInN on GaN," *Jap. J. Appl. Phys.*, (1997) vol. 36, pp. L177-L179.

Takeya et al., "Degradation in AlGaInN Lasers," *Phys. Stat. Sol. (c)*, (2003) 0, No. 7, pp. 2292-2295.

Taniyasu et al., "An aluminum nitride light-emitting diode with a wavelength of 210 nanometres", *Nature*, 441 (2006) 325.

Taniyasu et al., "Intentional control of n-type conduction for Si-doped AlN and $Al_xGa_{1-x}N$ (0.42≦x≦1)", *Applied Physics Letters*, 81 (2002) 1255.

Tomiya et al., "Dislocations in GaN-Based Laser Diodes on Epitaxial Lateral Overgrown GaN Layers," *Phys. Stat. Sol. (a)*, (2001) vol. 188, No. 1, pp. 69-72.

Van de Walle et al., "Doping of AlGaN Alloys," *MRS Internet J. Nitride Semicond. Res.*, (1999) 4S1, G10.4, pp. 1-12.

Van de Walle et al., "DX-center Formation in Wurtzite and Zincblende $AlxGa1-xN$," *Phys. Rev.*, (1998) B57, R2033.

Vendl et al., "The melting points of some rare-earth metal nitrides as function of the nitrogen pressure", *High Temperatures—High Pressures*, 9 (1977) 313.

Venugopal et al., "Comparison of Various Buffer Schemes to Grow GaN on Large-Area Si(111) Substrates Using Metal-Organic Chemical-Vapor Deposition," *32 J. Electronic Mat.*, vol. 32, No. 5 (2003) pp. 371-374.

Vinogradov et al., "Determination of the Melting Parameters of Aluminum Nitride," *High Temperatures—High Pressures*, (1991) 23:685.

Wentorf Jr., "Synthesis of the cubic form of boron nitride", *J. Chem. Phys.*, 34 (1961) 809.

Yamane et al., "Preparation of GaN single crystals using a Na flux", *Chem. Mater.*, 9 (1997) 413.

Yano et al., "Growth of nitride crystals, BN. AlN and GaN by using a Na flux", *Diamond and Related Materials*, 9 (2000) 512.

Zeisel et al., "DX-behavior of Si in AlN," *Phys. Rev.*, (2000) B61, R16283.

Zhuang et al., "Seeded growth of AlN single crystals by physical vapor transport," *Jrl. of Crys. Growth*, (Jan. 25, 2006), vol. 287, No. 2, pp. 372-375.

Atobe—JJAP, 29, 150, 1990—F-Type Centers in Neutron-Irradiated AlN.

Berzina—RadEFF 157, 1089, 2002—Luminescence mechanisms of O-related defects in AlN.

Bickermann et al., "Point Defect Content and Optical Transitions in Bulk Aluminum Nitride Crystals," Phys. Stat. Sol. B 246, No. 6, pp. 1181-1183 (2009).

Bickerman pssc 0, 1993-1996, 2003—PVT growth of bulk AlN.

Bickerman—APL,103,073522, 2008—Polarization dependent below BG optical absorption of AlN bulk crystals.

Bradley—JVacSciTechB 21, 2558, 2003—Deep level defects and doping in high Al mole fraction AlGaN.

Summons to Attend Oral Proceedings in European Patent Application No. 03808366.3, Dec. 17, 2007, 5 pages.

Tavernier et al., "Chemical Mechanical Polishing of Gallium Nitride," Electrochemical and Solid State Latters, v. 5(8), pp. G61-G64 (2002).

Brunner—JAppPhys 82, 5090, 1997—Optical constants of epitaxial AlGaN films and their temperature dependence.

Collins—PRB 158, 833, 1967—Lattice vibration spectra of AlN.

Edgar—JCrGrwth 310, 4002, 2008-Native oxide and hydroxides and their implications for bulk AlN crystal growth.

Evans—APL 88, 06112, 2006—EPR of a donor in AlN crystals.

Freitas—pssb 240, 330, 2003—Shallow donors in GaN.

Freitas—APL 83, 2584,2003—Properties of bulk AlN grown by thermodecomposition of AlCl3-NH3.

Freitas—JCrGrwth 281, 168, 2005—Optical studies of bulk and homoepitaxial films of III-V nitride semiconductors.

Gutierrez—Phil.Mag.Let. 79, 147, 1999—The formation of nanopipes caused by donor impurities in GaN; a theoretical study for the case of oxygen.

Honda—JJAP 29, L652, 1990—Electron paramagnetic center in neutron-irradiated AlN.

Hossain—SPIE 2877, 42, 1996—Study of CL spectroscopy of AlN.

Jones—JMR 14, 4344, 1999—Optical properties of Aln from VUS and ellipsometry.

Kazan—Diamond15, 1525, 2006—Phonon dynamics in AlN lattice contaminated by O.

Kazan—JAP, 98, 103529,2005—Oxygen behavior in AlN.

Klemens—PhysB, 316-317,413, 2002—Effect of point defects on the decay of the longitudinal optical mode.

Kovalenkov—JCrGrwth 28187, 2005—Thick AlN layers grown by HVPE.

Mason—PRB 59, 1937, 1999—Optically detected EPR of AlN single crystals.

McCluskey—PRL 80 4008 1998—Metastability of oxygen donors in AlGaN.

Meyer—Mat.Scie.EngB71,69,2000—Defects and defect identication in group III-nitrides.

Morita—JJAP 21, 1102, 1982—Optical absorption and CL of epitaxial AlN films.

Nakahata—JAmCerSoc 80, 1612, 1997—Electron spin resonance analysis of lattice defects in poly AlN.
Nakarmi—APL 94, 091903, 2009—PL studies of impurity transitions Mg-doped AlGaN alloys.
Nam—APL 86, 222108, 2005—Deep Impurity transitions involving cation vacancies and complexes in AlGaN alloys.
Nepal—APL 84, 1091, 2004—Optical properties of the nitrogen vacancy in AlN epilayers.
Nepal—APL 89, 092107, 2006—Photoluminescene studies of impurity transitions in AlGaN alloys.
Wongchotigul et al., "Low Resistivity Aluminum Nitride:Carbon (AlN:C) Films Grown by Metal Organic Chemical Vapor Deposition," 26 Materials Letters, pp. 223-226 (Mar. 1996).
Pantha—APL 91, 121117, 2007—Correlation between biaxial stress and free exciton transition in AlN.
Perry and Rutz—APL 33, p319, 1978—The optical absorption edge of single-crystal AlN prepared by a closed-spaced vapor process.
Salzman—pssc 0, 2541, 2003—Reduction of oxygen contamination in AlN.
Sarua—MRS 798, Y17.1, 2004—Effect of impurities on Raman and PL spectra of AlN bulk crystals.
Schlesser—JCrGrwth 281, 75, 2005—Crucible materials for growth of aluminum nitride crystals.
Schweizer—ppsb 219, 171, 2000—Investigation of oxygen-related luminescence centres in AlN ceramic.
Sedhain—APL 93, 014905, 2008—Photoluminescence properties of AlN homeopilayers with different orientations.
Shi—APL89, 163127, 2006—Luminescence properties of AlN nanotips.
Stampfl—PRB 65, 155212, 2002—Theoretical investigation of native defects, impurities and complexes in aluminum nitride.
Strassburg—JAP 96, 5870,2004—Growth and optical properties of large high quality AlN single crystals.
Thomas—J.Eur.Cer.Soc. 1991—Determination of the concentration of oxygen dissolved in the AlN lattice.
Trinkler—JphysCondMatt 13, 8931, 2001—Radiation induced recombination processes in AlN ceramics.
Trinkler—RadiationMeasurements 33, 731, 2001—Stimulated luminescence of AlN ceramics induced by UV radiation.
Trinkler—SPIE 2967, 85, 1997—Spectral properties of AlN ceramics.
Tuomisto—JCrGrwth 2008—Characterization of bulk AlN crystals with position annihilation spectroscopy.
Vail—JPhysCondMat18,21225, 2006—The nitrogen vacancy in AlN.
Van de Walle—AppPhysRev 95,3852 2004—First principles calculations for defects and impurities—Application s to iii-nitrides.
Watanabe—JMR13,2956,1998—Changes in optical transmittance and surface morphology of AlN thin films exposed to atmosphere.
Katayama-Yoshida et al., "Codoping method for the Fabrication of Low-Resistivity Wide Band-Gap Semiconductors in p-type GaN, p-type AlN and n-type Diamond: Prediction versus Experiment," 13 J. of Physics: Condensed Matter, pp. 8901-8914 (2001).
Office Action in Australian Patent Application No. 2003303485, Oct. 9, 2008, 2 pages.
Office Action in Canadian Patent Application No. 2,467,806, Aug. 13, 2009, 4 pages.
Office Action in Canadian Patent Application No. 2,467,806, Feb. 23, 2010, 2 pages.
Office Action in European Patent Application No. 02803675.4, May 2, 2007, 4 pages.
Office Action in European Patent Application No. 02806723.9, Aug. 8, 2008, 3 pages.
Office Action in European Patent Application No. 02806723.9, dated Feb. 16, 2010 (2 pages).
Office Action in European Patent Application No. 02806723.9, Feb. 7, 2007, 4 pages.
Office Action in European Patent Application No. 02806723.9, Jan. 17, 2008, 4 pages.
Office Action in European Patent Application No. 03808366.3, dated Sep. 28, 2006, 4 pages.
Office Action in European Patent Application No. 06844804.2, Mar. 4, 2009, 3 pages.
Office Action in Japanese Patent Application No. 2003-545445, mailed Nov. 10, 2009, 3 pages (translation).
Office Action in Japanese Patent Application No. 2003-545445, mailed Sep. 30, 2008, 3 pages (translation).
Office Action in Japanese Patent Application No. 2003-579324, Sep. 8, 2009, 1 page (translation).
Office Action in Japanese Patent Application No. 2004-564648, Feb. 3, 2010, 2 pages (translation).
Office Action in Japanese Patent Application No. 2004-564648, Jun. 24, 2009, 2 pages (translation).
Office Action in Taiwan Patent Application No. 91137050, Apr. 6, 2004, 1 page (translation).
Partial International Search Report for International Application No. PCT/US07/11075, dated May 7, 2008 (2 pages).
Raghothamachar et al., "X-ray Characterization of Bulk AlN Single Crystals Grown by the Sublimation Technique," J. Crystal Growth 250(1-2), pp. 244-250 (2003).

* cited by examiner

__US 8,080,833 B2__

THICK PSEUDOMORPHIC NITRIDE EPITAXIAL LAYERS

RELATED APPLICATIONS

This application is a continuation-in-part of U.S. patent application Ser. No. 12/020,006, filed Jan. 25, 2008, which claims the benefit of and priority to U.S. Provisional Application Ser. No. 60/897,572, filed Jan. 26, 2007. This application also claims the benefit of and priority to U.S. Provisional Application Ser. No. 61/252,408, filed Oct. 16, 2009. The entire disclosure of each of these applications is hereby incorporated by reference.

GOVERNMENT SUPPORT

This invention was made with United States Government support under 70NANB7H7020 awarded by the National Institute of Standards and Technology (NIST). The United States Government has certain rights in the invention.

FIELD OF THE INVENTION

The technology disclosed herein relates generally to lattice-mismatched semiconductor heterostructures, in particular pseudomorphic layers having a thickness greater than the critical thickness predicted therefor.

BACKGROUND

Achieving low defect densities throughout a semiconductor active device layer is important for the fabrication of a commercially practical nitride-based semiconductor device. As described in U.S. patent application Ser. No. 11/503,660 ("the '660 application"), the entire disclosure of which is hereby incorporated by reference, it is possible to form large-diameter, low-defect-density AlN substrates. However, many desirable device applications preferably incorporate device layers based on alloys of AlN, GaN, and InN to be grown on the AlN substrate. As the concentration of GaN and InN is increased, the lattice mismatch with respect to the AlN substrate also increases. For instance, the lattice parameter in the c-plane of GaN is approximately 2.4% larger than that of AlN. When a lattice-mismatched layer is epitaxially grown on a substrate, the initial layer typically grows pseudomorphically—that is, the epitaxial layer will be compressed (experience compressive strain) in the plane of the substrate surface if the intrinsic lattice parameter of the substrate is smaller than that of the epitaxial layer. The epitaxial layer will be stretched or put under tensile strain when the intrinsic lattice parameter of the epitaxial layer is smaller than that of the substrate. However, as the thickness of the epitaxial layer is increased, the strain energy in the epitaxial layer will grow and, typically, the layer will find some way to reduce the strain energy. This may occur by plastic flow through the motion of dislocations, through the creation of surface morphological features which allow strain relaxation, or, particularly when the strain is tensile, through cracking of the film.

Pseudomorphic layers are attractive for at least two reasons. The first is that when an epitaxial layer is grown on a low-dislocation substrate, the pseudomorphic epitaxial layer may also be grown with very low dislocation densities, often with the same dislocation density as the substrate. The second advantage accrues from the ability to tailor the band structure through the large resulting biaxial strains. For example, the strain can be used to break the degeneracy between heavy and light carrier bands and, as a result, obtain higher carrier mobilities.

However, even thick pseudomorphic layers may be insufficient for the fabrication of high-output-power light-emitting devices such as light-emitting diodes (LEDs) and lasers. Such devices are generally sensitive to strain-relieving defects, placing constraints on not only the light-emitting active layer(s) (which are generally one or more strained quantum wells), but also adjoining layers, as defects in adjoining layers may propagate through the active layer(s) even if the active layer(s) remain pseudomorphically strained. Because adjoining layers generally require particular thicknesses and/or compositions to enable, e.g., adequate electrical contact to the device, if these layers are maintained in a pseudomorphic state, the allowable thickness for the active layer(s) (in order to maintain the entire "stack" of layers in a pseudomorphic state) may be diminished, thus decreasing the potential output power of the finished device. Moreover, such layers may require high doping levels to enable low-resistance contacts to the device, and compositions closely lattice-matched with device active layers and/or the underlying substrate may be difficult to dope at high levels. Thus, there is a need for devices having pseudomorphic active layer(s) the thickness of which is not constrained by the strain state of adjoining layers but that remain substantially defect-free (e.g., having a density of defects such as threading dislocations that is approximately equal to the defect level of the underlying substrate), and that are capable of being doped at high levels.

SUMMARY

A technique is provided for growing very thick pseudomorphic films of alloys of AlN, GaN, and InN on high-quality AlN substrates. A pseudomorphic film is one where the strain parallel to the interface is approximately that needed to distort the lattice in the film to match that of the substrate. Thus, the parallel strain in a pseudomorphic film will be nearly or approximately equal to the difference in lattice parameters between an unstrained substrate parallel to the interface and an unstrained epitaxial layer parallel to the interface. As used herein, "very thick" refers to a thickness of the epitaxial layer that substantially exceeds (by a factor of at least 5 for substantially In-free layers or by a factor of at least 10 for layers including In) the expected critical thickness for the epitaxial film based on standard calculations of the thickness where strain relaxation should start to occur through the nucleation and/or motion of threading dislocations (or energy equilibrium calculations). The expected critical thickness may be calculated as described in, e.g., Matthews and Blakeslee, *J. Crystal Growth* 27, 118 (1974), and/or U.S. Pat. No. 4,088,515, the entire disclosure of each being hereby incorporated by reference.

The pseudomorphic layers are utilized as active layers of light-emitting devices such as LEDs and lasers, thus enabling fabrication of such devices having high output power. The electrical properties of the devices are optimized, via maximization of the thickness of the pseudomorphic active layers, by intentional relaxation of other layers in the device. The intentional relaxation, performed by, e.g., deposition of at least a portion of the layer in a substantially islanded growth mode, is performed only in layers contributing to majority carrier transport (i.e., not minority carrier transport, which is vastly more sensitive to defects) and in regions where resulting strain-relieving defects do not intersect the active layer(s). Thus, the thickness of the pseudomorphic active layers and other layers (e.g., contact layers) may be maximized, increasing output power and efficiency while decreasing contact resistance. The intentional relaxation also enables the use of contact or capping layers not closely lattice-matched to the active layers or the underlying substrate and/or that are more easily doped to high dopant concentrations. In one aspect, embodiments of the invention feature a semiconductor device including or consisting essentially of an aluminum nitride single-crystal substrate, at least one pseudomorphic strained layer disposed thereover, and, disposed over the strained layer(s), a semiconductor layer that is lattice-mismatched to the substrate and substantially relaxed. The at least one strained layer may include or consist essentially of AlN, GaN, InN, and/or an alloy thereof. An array of misfit dislocations may be disposed at the interface between the strained layer and the semiconductor layer.

Embodiments of the invention may include one or more of the following in any of a variety of combinations. The relaxed semiconductor layer may include a plurality of defects that do not propagate into the at least one strained layer. A metal contact layer may be disposed over the relaxed semiconductor layer. The relaxed semiconductor layer may include or consist essentially of gallium nitride, e.g., p-type-doped gallium nitride. The relaxed semiconductor layer may be p-type doped to a hole concentration at room temperature ranging between approximately $1\times10^{17}/cm^3$ and approximately $1\times10^{20}/cm^3$. The at least one strained layer may have a thickness exceeding the predicted critical thickness associated therewith by at least a factor of 5, the predicted critical thickness being calculated with the Matthews-Blakeslee theory. The thickness of the at least one strained layer may exceed the predicted critical thickness by at least a factor of 10. A pattern including or consisting essentially of a plurality of cones may be disposed on the bottom surface of the substrate. Each of the plurality of cones may have an apex angle of approximately 26°. The defect density of the relaxed semiconductor layer may be at least two orders of magnitude, or even at least five orders of magnitude, larger than the defect density of the substrate.

In another aspect, embodiments of the invention feature a method of forming a semiconductor device. At least one pseudomorphic strained layer is formed over a single-crystal substrate, the strained layer(s) including or consisting essentially of AlN, GaN, InN, and/or an alloy thereof. A semiconductor layer that is lattice-mismatched to the substrate and substantially relaxed is formed over the at least one strained layer without (i) relaxing the at least one strained layer, and (ii) propagation of defects from the semiconductor layer into the at least one strained layer. An array of misfit dislocations may be formed at the interface between the relaxed semiconductor layer and the at least one strained layer.

Embodiments of the invention may include one or more of the following in any of a variety of combinations. The at least one strained layer may have a thickness exceeding the predicted critical thickness associated therewith by at least a factor of 5, the predicted critical thickness being calculated with the Matthews-Blakeslee theory. The thickness of the at least one strained layer may exceed the predicted critical thickness by at least a factor of 10. A metal contact layer may be formed over the relaxed semiconductor layer. The substrate may include or consist essentially of aluminum nitride, and the relaxed semiconductor layer may include or consist essentially of gallium nitride. Forming the semiconductor layer may include or consist essentially of forming at least a portion of the relaxed semiconductor layer as a series of islands. The thickness of the semiconductor layer may be increased such that the series of islands coalesces into a unified layer. The at least one strained layer and the relaxed semiconductor layer may both be formed by epitaxial deposition. A pattern of cones may be formed, e.g., by etching, on the back surface of the substrate. At least a portion of the substrate may be removed, e.g., by grinding or polishing.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. As used herein, the term "substantially" means ±10%, and in some embodiments, ±5%.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Fabrication Techniques

Figure 1:
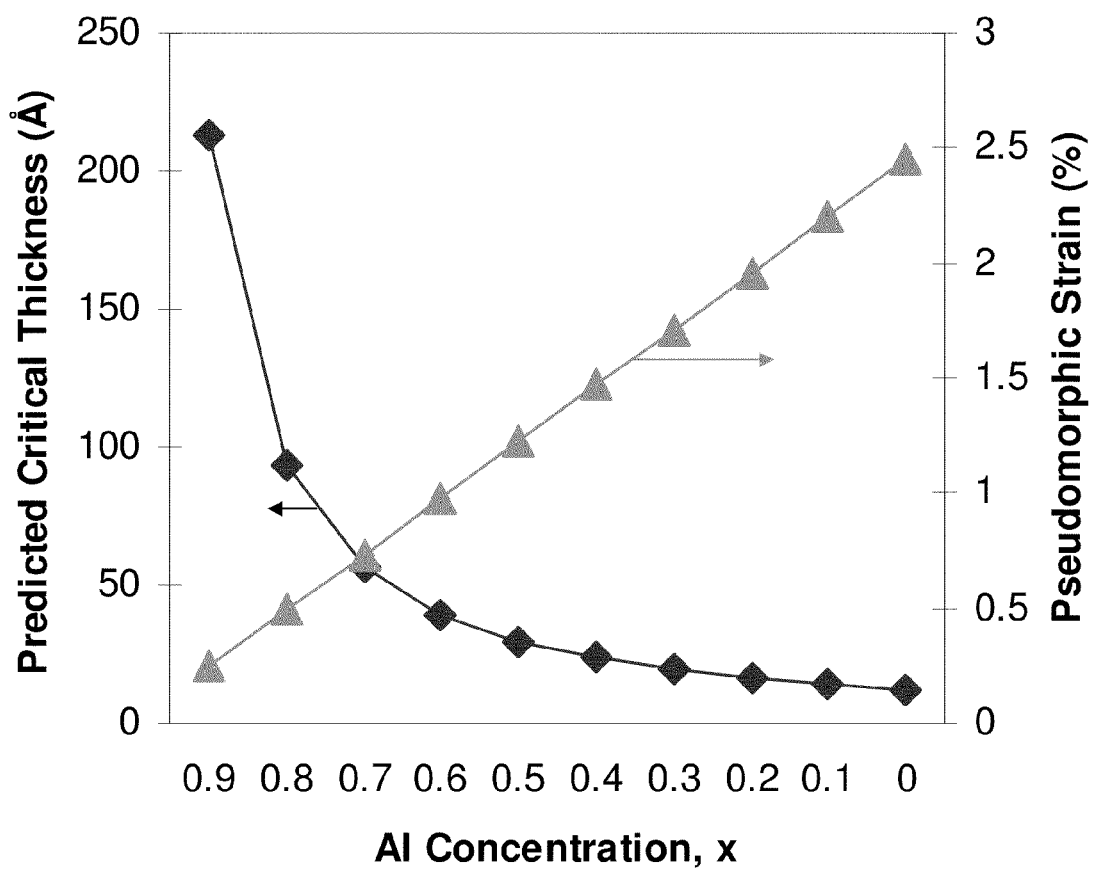
FIG. 1 is a graph of predicted critical thickness and pseudomorphic strain for $Al_xGa_{1-x}N$ layers of various Al contents x formed on AlN substrates.

The predicted critical thickness, calculated in accordance with the Matthews-Blakeslee theory as a function of Al concentration in $Al_xGa_{1-x}N$ layer growth on a c-face AlN substrate, is shown in FIG. 1. Also shown is the pseudomorphic strain of the $Al_xGa_{1-x}N$ layers attained in the absence of relaxation. Unexpectedly, we have found that it is possible to grow pseudomorphic layers with thicknesses much greater than the predicted critical thickness. For example, the critical thickness of an $Al_xGa_{1-x}N$ layer with x=0.6 is about 40 nanometers (nm), as shown in FIG. 1. We have been able to grow layers with this Al concentration to a thickness exceeding 1 micrometer (μm) and still obtain a pseudomorphically strained layer that is of very high quality and mirror smooth. As used herein, the term "high quality" refers to epitaxial layers having a threading dislocation density of approximately $10^6$ cm$^{-2}$ or less. In certain embodiments, $10^4$ cm$^{-2}$ or less, or even approximately $10^2$ cm$^{-2}$ or less. The term "pseudomorphic" is utilized herein to refer to epitaxial layers strained to at least approximately 80% of a lattice parameter of an underlying substrate (i.e., less than approximately 20% relaxed to its innate lattice parameter). In some embodiments, a pseudomorphic layer may be approximately fully strained to the lattice parameter of the underlying substrate. The term "mirror smooth" refers to layer root-mean-squared ("RMS") surface roughnesses less than approximately 5 nm in a 5 μm×5 μm area (as measured by an atomic-force microscope). In preferred embodiments the RMS surface roughness is less than approximately 1 nm in a 5 μm×5 μm area.

Figure 2:
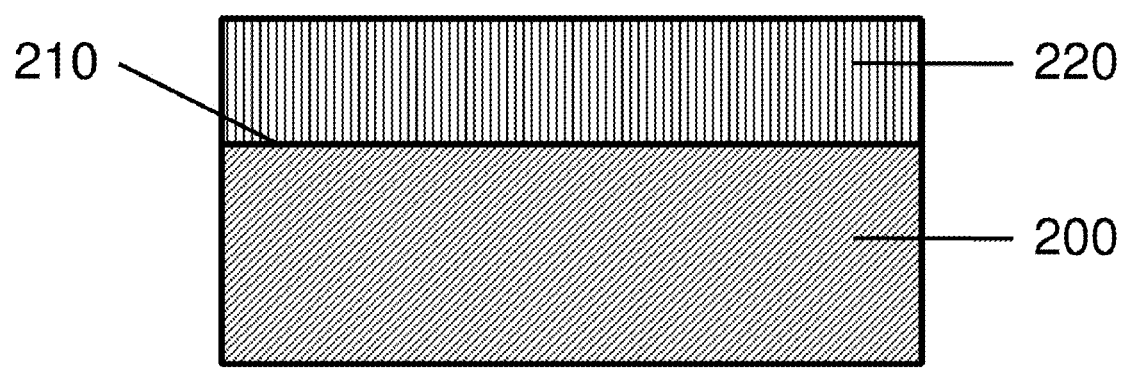
FIG. 2 is a schematic depicting a pseudomorphic strained layer formed on a substrate.

A thick pseudomorphic semiconductor layer fabricated in accordance herewith is shown in FIG. 2. A semiconductor substrate 200 is provided. In an embodiment, semiconductor substrate 200 includes or consists essentially of AlN. The top surface 210 of semiconductor substrate 200 may be prepared for epitaxial growth by at least one of planarization (e.g., by chemical-mechanical polishing) or cleaning prior to deposition of one or more epitaxial layers thereon. A strained epitaxial layer 220 is then deposited on semiconductor substrate 200, e.g., by organometallic vapor-phase epitaxy, to a thickness exceeding its predicted critical thickness. As can be seen in FIG. 1, the predicted critical thickness of an exemplary epitaxial layer 220 consisting of $Al_xGa_{1-x}N$ grown on a semiconductor substrate 200 consisting of AlN depends on the Al content x. In an embodiment, the thickness of epitaxial layer 220 exceeds its predicted critical thickness by at least a factor of 5, or even by at least a factor of 10, and epitaxial layer 220 remains pseudomorphic. The thickness of epitaxial layer 220 may even exceed its predicted critical thickness by a factor of 20 or more.

In certain embodiments, epitaxial layer 220 may actually consist of a plurality of discrete layers, each one pseudomorphically strained to the lattice parameter of semiconductor substrate 200. The plurality of layers may include layers with graded composition, e.g., layers including AlN, InN, and/or GaN in which the concentration of one or more of the group III atoms changes with thickness. Such layers may be graded in discrete steps or linearly in composition.

Strained epitaxial layer 220 may also be deposited on an optional relaxed semiconductor layer (not shown) formed over semiconductor substrate 200. In this case, the strain in epitaxial layer 220 and the predicted critical thickness therefor will be a function of the lattice parameter of the relaxed semiconductor layer rather than that of semiconductor substrate 200. Epitaxial layer 220 remains pseudomorphic, and the thickness of epitaxial layer 220 exceeds this predicted critical thickness by at least a factor of 5. In certain embodiments, the thickness of epitaxial layer 220 exceeds this predicted critical thickness by at least a factor of 10 or even at least a factor of 20. Thus, either semiconductor substrate 200 or the optional relaxed semiconductor layer can act as a relaxed "platform" to which epitaxial layer 220 is strained.

The ability to grow highly strained alloys of III-nitride on substrates with low threading dislocation density ("TDD"), e.g., certain AlN substrates, has been found to be dependent on: (i) substrate crystal quality, (ii) surface preparation, (iii) crystal orientation of the substrate surface, (iv) alloy concentration, (v) growth conditions including substrate temperature and V-III ratio during growth, and/or (vi) rate of grading of the alloy concentration. Relaxation of epitaxial layer 220 may be minimized or eliminated by maintenance of low surface roughness during epitaxial growth. Roughening of the layer surface or island formation may lead to detrimental relaxation of the layer. Defects at the surface of the semiconductor substrate 200, which may be due either to defects in the substrate which have propagated to the surface or to improper surface cleaning, may also cause roughening of epitaxial layer 220. Once roughening occurs, strain relaxation occurs at the sidewalls of terraces and islands on the epitaxial surface. When these terraces and islands coalesce, they may deleteriously form high densities of threading dislocations at the coalescence boundaries.

Maintenance of step-flow growth during the epitaxial deposition aids the prevention of relaxation, and the proper conditions for step-flow growth depend on the substrate orientation of the semiconductor substrate 200. When substrates are very closely oriented to on-axis (i.e., the surface normal of the substrate is very closely aligned to a major crystallographic axis), the density of steps across the surface of the substrate is low. Thus, incoming Al, Ga, or In atoms must diffusive relatively large distances to incorporate into the growing epitaxial layer at a step edge, i.e., maintain step-flow growth. Thus, step-flow growth may be maintained by (i) enhancing the long-distance diffusion of incoming atoms of the growth species and/or (ii) reducing the diffusion distance required to reach a step edge (i.e., increase the step density on the surface). Such long-distance diffusion may be enhanced by performing the epitaxial growth at higher temperatures (i.e., up to approximately 1100° C. or, in the case of In-free, high Al content (e.g., greater than approximately 50% Al content), by increasing the growth temperature to a range of greater than approximately 1100° C. to approximately 1300° C. In some embodiments, e.g., for Al concentrations greater than 50%, long-distance diffusion may also be enhanced by decreasing the ratio of the nitrogen species (i.e., the group V species) in the epitaxial reactor in comparison to the group III species. In an embodiment, a V-III ratio beneficial for enhancing long-distance diffusion of the growth species is less than approximately 1,000, and may even be less than approximately 10. The density of step edges on semiconductor substrate 200 may also be increased (thus reducing the required diffusion distances required to reach a step) by increasing the misorientation between the major crystallographic axis and the surface normal of the substrate. In an embodiment, the misorientation of semiconductor substrate 200 ranges between approximately 0.5° and approximately 2°, e.g., approximately 1°.

Kinetic barriers to strain relaxation may also be beneficially utilized to produce thick pseudomorphic epitaxial layers. Since any alloy of AlN, GaN, and InN (with nonzero content of either GaN or InN) will have a larger relaxed lattice parameter than an underlying AlN substrate, these epitaxial films will typically not relax by cracking. Relaxation may occur by the formation of misfit dislocations which run parallel to the interface between the AlN substrate and epitaxial alloy layer. These misfit dislocations may either result from the motion of existing threading dislocations which propagate into epitaxial layer 220 from semiconductor substrate 200, or from new dislocation loops forming either from the surface or from some macroscopic defect on the surface of substrate 200. Thus, the elimination of defect sources in semiconductor substrate 200 creates kinetic barriers to relaxation, facilitating the fabrication of thick pseudomorphic epitaxial layer 220. In an embodiment, semiconductor substrate 200 has a threading dislocation density less than approximately $10^6$ $cm^{-2}$. In other embodiments, semiconductor substrate 200 has a threading dislocation density less than approximately $10^4$ $cm^{-2}$ or even less than approximately $10^2$ $cm^{-2}$. Semiconductor substrate 200 may also have a density of particulate surface defects less than approximately 100 $cm^{-2}$. Utilization of such optimized semiconductor substrates minimizes or eliminates glide of existing dislocations and dislocation nucleation at surface defects as relaxation mechanisms. The remaining relaxation mechanism—surface nucleation of dislocation loops—occurs only at strain energies sufficiently high to facilitate fabrication of thick pseudomorphic epitaxial layers. Therefore, the fabrication of thick strained epitaxial layer 220 having a thickness greater than its predicted critical thickness by at least approximately a factor of 5 is facilitated. Moreover, since In may have the additional effect of hindering dislocation motion and concomitant relaxation, a strained epitaxial layer 220 containing In may achieve a pseudomorphic thickness greater than its predicted critical thickness by at least approximately a factor of 10.

In addition, certain crystallographic orientations of semiconductor substrate 200 may be particularly favorable in the fabrication of thick epitaxial layers of highly strained alloys. In particular, Liu et al. point out, the main slip system of the wurzite crystal structure of GaN and its alloys is <11.2>{00.2}. (See R. Liu, J. Mei, S. Srinivasan, H. Omiya, F. A. Ponce, D. Chems, Y. Narukawa and T. Mukai, "Misfit Dislocation Generation in InGaN Epilayers on Free-Standing GaN," *Jap. J. Appl. Physics* 45, L549 (2006), the entire disclosure of which is hereby incorporated by reference.) This slip system will not be active in a well-oriented c-face substrate (i.e., a substrate in which the surface normal is aligned with the c-axis of the crystal) since the lattice-mismatch strain will not result in any resolved stress to move dislocations along this plane. This phenomenon may limit the allowable miscut for c-face substrates to enable very large strains and/or thick pseudomorphic epitaxial layers thereon. However, as described above, step-flow growth is facilitated by a finite surface misorientation. Thus, in an embodiment, the misorientation of semiconductor substrate 200 is greater than 0° but is less than approximately 4°.

In one procedure, a large c-face AlN substrate with low dislocation density (roughly $5 \times 10^3$ cm$^{-2}$) was prepared as described in the '660 application. The miscut of this substrate was approximately 1°. The Al-polarity surface of the c-face AlN substrate—the (0001) face—was prepared as described in U.S. Pat. No. 7,037,838 ("the '838 patent"), the entire disclosure of which is hereby incorporated by reference. After introducing the substrate into an Aixtron model 200/4 RF-S organometallic vapor-phase epitaxy ("OMVPE") reactor, the substrate was heated to ~1100° C. under flowing hydrogen and ammonia gas mixture. Trimethylaluminum ("TMA") was then introduced and a 0.3-μm-thick AlN buffer layer was grown on the substrate at an approximate growth rate of 0.6 μm/hr. A graded layer $Al_xGa_{1-x}N$ was then grown by switching in trimethylgallium ("TMG") with ramping up TMG and ramping down the TMA gas flow to reach the target Al % over a 15 minute interval to grow approximately 0.1 μm of linearly graded alloy. After this transition layer, the TMA and TMG flows were kept constant and a final layer of ~63% Al concentration and approximately 0.6 μm thickness was grown with an approximate growth rate of 1.0 μm/hr. During growth, the chamber pressure was maintained at ~25 to 100 mbar. The V-III ratio was maintained between 500 and 2,000 during the growth sequence. The parallel strain (i.e., strain in the plane of the substrate) was measured to be slightly greater than 0.8% and represented pseudomorphic growth even though the layer exceeded the predicted critical thickness by more than an order of magnitude. The double-crystal ω rocking curve widths about the (00.2) and the (10.2) reflections (measured with a Philip X'Pert system) for the $Al_xGa_{1-x}N$ layer were 50 arcsec and 60 arcsec, respectively. The strain parallel to the interface was measured to be nearly 1% and the epitaxial layer was pseudomorphic to the underlying AlN substrate. Etch pit densities were measured using a molten KOH etch to determine the density of threading dislocations in the $Al_xGa_{1-x}N$ epitaxial layer. The measured densities were in the range of $0.8-3 \times 10^5$ cm$^{-2}$.

A similar procedure was used to grow a 0.6 μm-thick epitaxial layer of an $Al_xGa_{1-x}N$ alloy that had an Al concentration of 50%. In this case, the strain parallel to the interface remained ~1%, which represents approximately 80% of the fully pseudomorphic strain.

In another procedure, a large c-face AlN substrate with a dislocation density of approximately $5 \times 10^3$ cm$^{-2}$ was prepared as described in the '660 application. The Al-polarity surface of the c-face AlN substrate (misaligned by approximately 1.5°) was prepared as described in the '838 patent. After introducing the substrate into a Veeco D180 OMVPE reactor, the substrate was heated to approximately 1100° C. under a flowing hydrogen and ammonia gas mixture. TMA was then introduced and a 0.4 μm-thick AlN buffer layer was grown on the substrate at an approximate growth rate of 0.4 μm/hr. A graded layer $Al_xGa_{1-x}N$ was then grown by switching in TMG with ramping up TMG while maintaining TMA gas flow to reach the target Al % over a 6-minute interval to grow approximately 0.05 μm of linearly graded alloy. After this transition layer, the TMA and TMG flows are kept constant and a final layer of ~58% Al concentration and approximately 0.5 μm thickness was grown with an approximate growth rate of 0.8 μm/hr. During growth, the chamber pressure was maintained at approximately 20 Torr. The V-III ratio was maintained between 900 and 3,200 during growth sequence. The parallel strain was measured to be slightly greater than 1.0% and represented pseudomorphic growth even though the layer exceeded the predicted critical thickness by more than an order of magnitude.

While imperfect surface preparation may increase the dislocation density, this can be remedied by improving the surface preparation. For low-defect AlN substrates, appropriate surface preparation techniques are described in the '838 patent and in U.S. Patent Application Publication No. 2006/0288929A1, the entire disclosure of which is hereby incorporated by reference.

As pseudomorphic epitaxial layer(s) 220 experience little or no lattice relaxation, the threading dislocation density therein may be approximately equal to the threading dislocation density of semiconductor substrate 200. For example, substrates from AlN boules grown by the techniques described in the '660 application may have very low dislocation densities—under 10,000 cm$^{-2}$, typically about 1,000 cm$^{-2}$, and, in certain embodiments, under 500 cm$^{-2}$ and even under 100 cm$^{-2}$—that are "inherited" by pseudomorphic epitaxial layers grown thereon. In other embodiments, the threading dislocation density of epitaxial layer 200 may be greater than that of semiconductor substrate 200 by no more than approximately a factor of 10. Such low threading dislocation densities enable fabrication of highly efficient ultraviolet light-emitting diodes ("UV LEDs") and laser diodes ("LDs"), as well as electronic devices, such as transistors for high-frequency (e.g., >2 GHz), high-power operation.

In an embodiment, strained epitaxial layer 220 is substantially free of local elastic strain relaxation caused by the formation of, e.g., macroscopic defects such as islands and pinholes (further described below). Moreover, the strain in epitaxial layer 220 may be approximately completely a result of lattice mismatch to substrate 200. For example, epitaxial layer 220 will be approximately free of strain due to thermal expansion mismatch with substrate 200.

For device applications, polarization effects in epitaxial layer 220 may affect device performance. For epitaxial layer 220 fabricated on top surface 210 which is non-polar (e.g., the a- or m-plane of a substrate 200 consisting of AlN), polarization effects in the layer are minimized. This makes a subsequently formed device inherently insensitive to polarization effects associated with the surface, and eliminates or minimizes dc-to-RF dispersion observed in conventional devices grown on polar surfaces, e.g., the c-plane. On the other hand, pseudomorphic structures grown on the c-plane along the [0001] direction may have strong polarization effects which influence the charge distribution within the device. Preferably, the polarization charge at the channel/barrier interface is carefully increased to counteract backside depletion effects associated with the AlN/GaN hetero-interface transitioning from the AlN buffer structure.

Device Applications

A key issue limiting the performance of deep-UV LEDs is high dislocation density in the active device region which reduces the electrical efficiency, the internal quantum efficiency ("IQE"), and the lifetime of the devices. Briefly, as described in the Solid State Lighting Report (Dept. of Energy, 2007), the entire disclosure of which is hereby incorporated by reference, the electrical efficiency, $\eta_V$ (defined as photon energy divided by the product of the applied voltage and electron charge, i.e., $h\lambda/eV$), represents the amount of electrical energy converted to photon energy. The applied forward voltage is determined by the diode characteristics, and should be as low as possible in order to get the maximum current (and hence maximize the number of electrons eligible to convert to photons) for a given input power. The IQE is the ratio of the photons created in the active region of the semiconductor chip to the number of electrons injected into the LED.

Figure 3A:
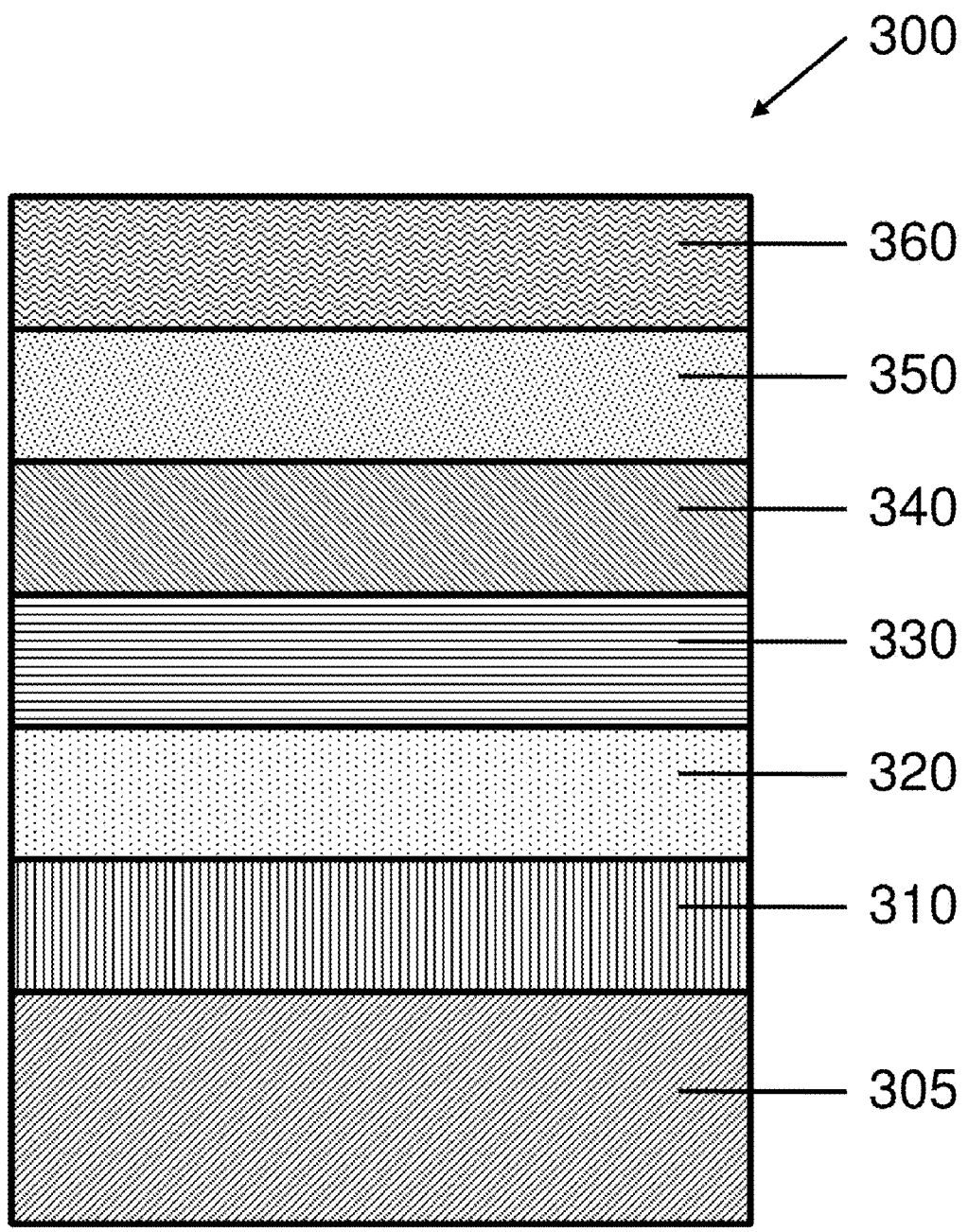
FIGS. 3A, 3B, and 3C are schematics of pseudomorphic strained layer-based device structures.

Referring to FIG. 3A, a pseudomorphic UV light emitting diode ("PUVLED") structure 300 is formed. A semiconductor substrate 305, which includes or consists essentially of one or more semiconductor materials, is provided. In an embodiment, semiconductor substrate 305 includes or consists essentially of a III-nitride semiconductor material, e.g., AlN. Semiconductor substrate 305 may be miscut such that the angle between its c-axis and its surface normal is between approximately 0.3° and approximately 4°. In a preferred embodiment, the misorientation of the surface of semiconductor substrate 305 is approximately 1°. The surface of semiconductor substrate 305 may have a group-III (e.g., Al-) polarity or N-polarity, and may be planarized, e.g., by chemical-mechanical polishing. In an embodiment, the surface of semiconductor substrate 305 is prepared as disclosed in the '838 patent. The RMS surface roughness of semiconductor substrate is preferably less than approximately 0.5 nm for a 10 μm×10 μm area. In some embodiments, atomic-level steps are detectable on the surface when probed with an atomic-force microscope. The threading dislocation density of semiconductor substrate 305 may be measured using, e.g., etch pit density measurements after a 5 minute KOH—NaOH eutectic etch at 450° C. Preferably the threading dislocation density is less than approximately $2\times10^3$ cm$^{-2}$. In some embodiments substrate 305 has an even lower threading dislocation density, as described above in reference to semiconductor substrate 200. Semiconductor substrate 305 may be topped with a homoepitaxial layer (not shown) that includes or consists essentially of the same semiconductor material present in semiconductor substrate 300, e.g., AlN.

In an embodiment, an optional graded buffer layer 310 is formed on semiconductor substrate 305. Graded buffer layer 310 may include or consist essentially of one or more semiconductor materials, e.g., $Al_xGa_{1-x}N$. In a preferred embodiment, graded buffer layer 310 has a composition approximately equal to that of semiconductor substrate 305 at an interface therewith in order to promote two-dimensional growth and avoid deleterious islanding (such islanding may result in undesired elastic strain relief in graded buffer layer 310 and subsequently grown layers). The composition of graded buffer layer 310 at an interface with subsequently grown layers (described below) is generally chosen to be close to (e.g., approximately equal to) that of the desired active region of the device (e.g., the $Al_xGa_{1-x}N$ concentration that will result in the desired wavelength emission from the PUVLED). In an embodiment, graded buffer layer 310 includes $Al_xGa_{1-x}N$ graded from an Al concentration x of approximately 100% to an Al concentration x of approximately 60%.

A bottom contact layer 320 is subsequently formed above substrate 305 and optional graded layer 310, and may include or consist essentially of $Al_xGa_{1-x}N$ doped with at least one impurity, e.g., Si. In an embodiment, the Al concentration x in bottom contact layer 320 is approximately equal to the final Al concentration x in graded layer 310 (i.e., approximately equal to that of the desired active region (described below) of the device). Bottom contact layer 320 may have a thickness sufficient to prevent current crowding after device fabrication (as described below) and/or to stop on during etching to fabricate contacts. For example, the thickness of bottom contact layer 320 may be less than approximately 200 nm. When utilizing a bottom contact layer 320 of such thickness, the final PUVLED may be fabricated with back-side contacts, as described below in reference to FIG. 4B. In many embodiments, bottom contact layer 320 will have high electrical conductivity even with a small thickness due to the low defect density maintained when the layer is pseudomorphic.

A multiple-quantum well ("MQW") layer 330 is fabricated above bottom contact layer 320. MQW layer 330 corresponds to the "active region" of PUVLED structure 300 and includes a plurality of quantum wells, each of which may include or consist essentially of AlGaN. In an embodiment, each period of MQW layer 330 includes an $Al_xGa_{1-x}N$ quantum well and an $Al_yGa_{1-y}N$ quantum well, where x is different from y. In a preferred embodiment, the difference between x and y is large enough to obtain good confinement of the electrons and holes in the active region, thus enabling high ratio of radiative recombination to non-radiative recombination. In an embodiment, the difference between x and y is approximately 0.05, e.g., x is approximately 0.35 and y is approximately 0.4. However, if the difference between x and y is too large, e.g., greater than approximately 0.3, deleterious islanding may occur during formation of MQW layer 330. MQW layer 330 may include a plurality of such periods, and may have a total thickness less than approximately 50 nm. Above MQW layer 330 may be formed an optional thin electron-blocking (or hole-blocking if the n-type contact is put on top of the device) layer 340, which includes or consists essentially of, e.g., $Al_xGa_{1-x}N$, which may be doped with one or more impurities such as Mg. Electron-blocking layer 340 has a thickness that may range between, e.g., approximately 10 nm and approximately 50 nm. A top contact layer 350 is formed above electron blocking layer 340, and includes or consists essentially of one or more semiconductor materials, e.g., $Al_xGa_{1-x}N$, doped with at least one impurity such as Mg. Top contact layer 350 is doped either n-type or p-type, but with conductivity opposite that of bottom contact layer 310. The thickness of top contact layer 350 is, e.g., between approximately 50 nm and approximately 100 nm. Top contact layer 350 is capped with a cap layer 360, which includes or consists essentially of one or more semiconductor materials doped with the same conductivity as top contact layer 350. In an embodiment, cap layer 360 includes GaN doped with Mg, and has a thickness between approximately 10 nm and approximately 200 nm, preferably approximately 50 nm. In some embodiments, high-quality ohmic contacts may be made directly to top contact layer 350 and cap layer 360 is omitted. In other embodiments, top contact layer 350 and/or electron-blocking layer 340 are omitted and the top contact is formed directly on cap layer 360 (in such embodiments, cap layer 360 may be considered to be a "top contact layer"). While it is preferred that layers 310-340 are all pseudomorphic, top contact layer 350 and/or cap layer 360 may relax without introducing deleterious defects into the active layers below which would adversely affect the performance of PUVLED structure 300 (as described below with reference to FIGS. 3B and 3C). As described below with reference to FIGS. 4A and 4B, etching and final contact formation completes the formation of PUVLED structure 300. Each of layers 310-350 is pseudomorphic, and each layer individually may have a thickness greater than its predicted critical thickness, as described above. Moreover, the collective layer structure including layers 310-350 may have a total thickness greater than the predicted critical thickness for the layers considered collectively (i.e., for a multiple-layer structure, the entire structure has a predicted critical thickness even when each individual layer would be less than a predicted critical thickness thereof considered in isolation).

Figure 3B:
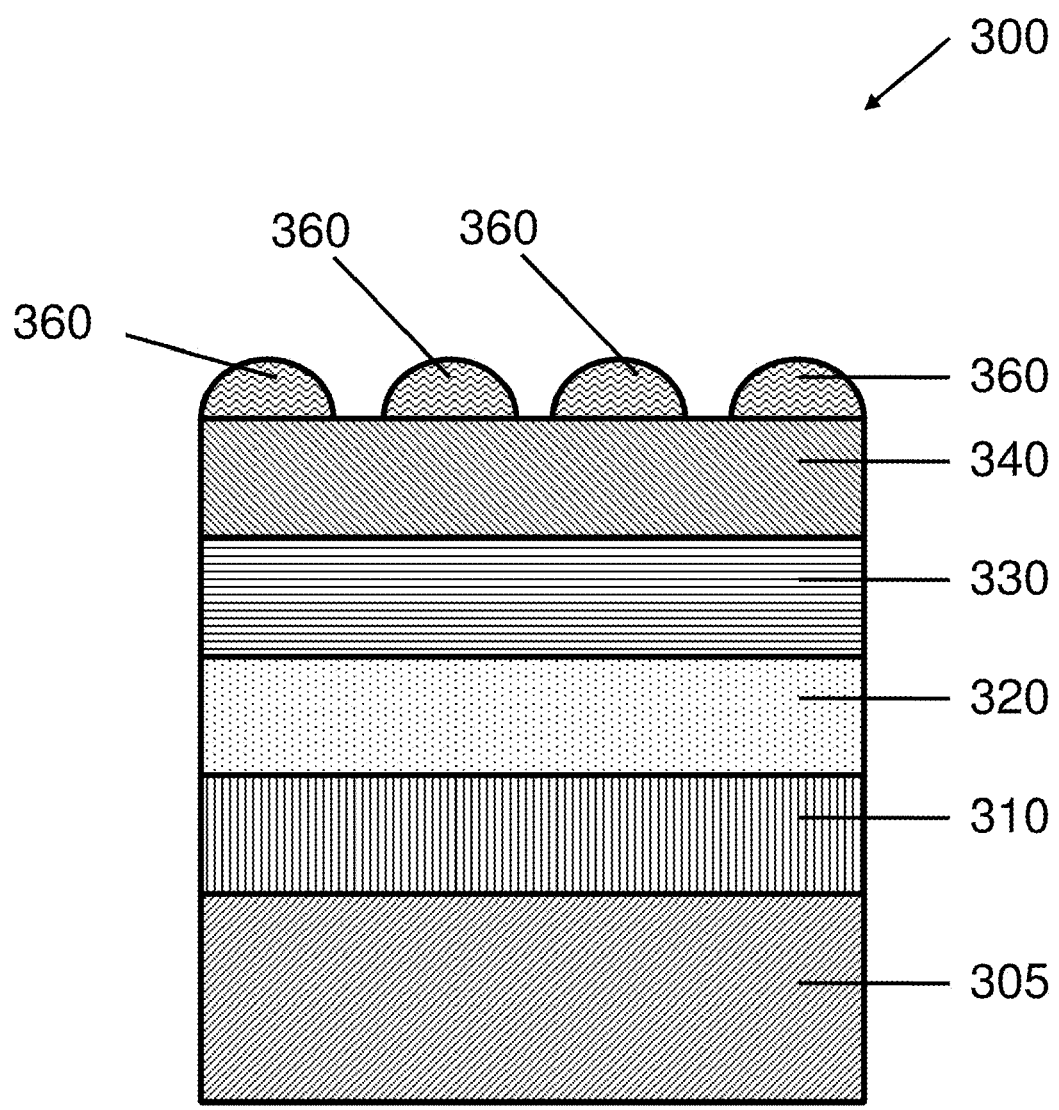
Figure 3C:
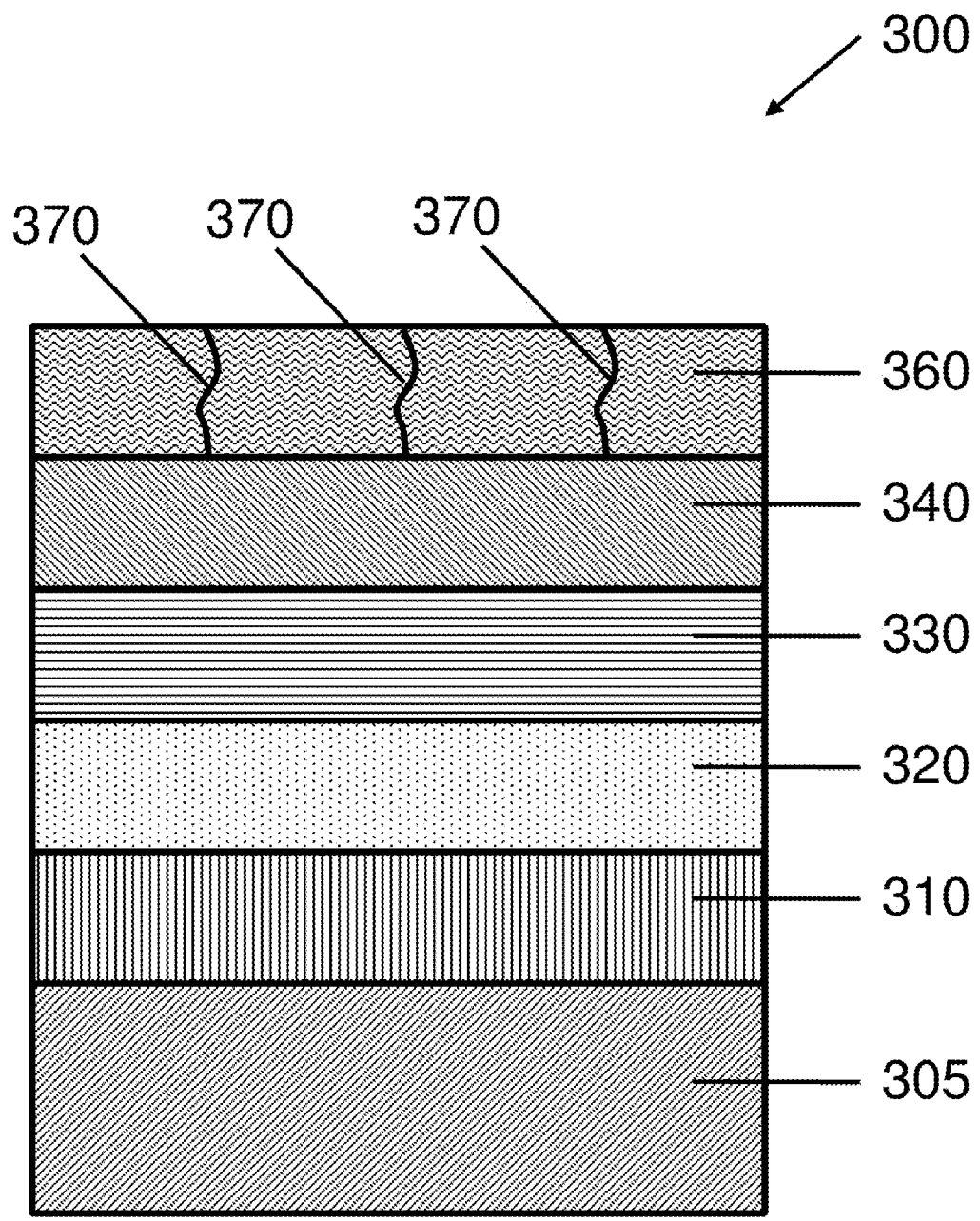

As described above, in a preferred embodiment, layers 310-340 of PUVLED structure 300 are pseudomorphic, and cap layer 360 is intentionally relaxed. As shown in FIGS. 3B and 3C, layers 310-340 are formed as described above with reference to FIG. 3A. Cap layer 360 is subsequently formed in a substantially strain-relaxed state via judicious selection of its composition and/or the deposition conditions. For example, the lattice mismatch between cap layer 360 and substrate 305 and/or MQW layer 330 may be greater than approximately 1%, greater than approximately 2%, or even greater than approximately 3%. In a preferred embodiment, cap layer 360 includes or consists essentially of undoped or doped GaN, substrate 305 includes or consists essentially of AlN, and MQW layer 330 includes or consists essentially of multiple $Al_{0.55}Ga_{0.45}N$ quantum wells interleaved with $Al_{0.7}Ga_{0.3}N$ barrier layers, and cap layer 360 is lattice mismatched by approximately 2.4%. Cap layer 360 may be substantially relaxed, i.e., may have a lattice parameter approximately equal to its theoretical unstrained lattice constant. A graded layer may be formed between layers 310-340 and cap layer 360, and its composition at its interfaces with layers 340, 360 may substantially match the compositions of those layers. The thickness of this graded layer, which is preferably pseudomorphically strained, may range between approximately 10 nm and approximately 50 nm, e.g., approximately 30 nm. In some embodiments, epitaxial growth may be temporarily stopped between growth of the graded layer and cap layer 360.

In an exemplary embodiment, an electron-blocking layer 340 including or consisting essentially of $Al_{0.8}Ga_{0.2}N$ is formed over MQW layer 330. Prior to formation of cap layer 360 including or consisting essentially of GaN, a graded layer is formed over electron-blocking layer 340. The graded layer is graded in composition from $Al_{0.8}Ga_{0.2}N$ to GaN over a thickness of approximately 30 nm. The graded layer may be formed by, e.g., MOCVD, and in this embodiment is formed by ramping the flow of TMA and TMG (by ramping the flow of hydrogen through their respective bubblers) from the conditions utilized to form electron-blocking layer 340 to 0 standard cubic centimeters per minute (sccm) and 6.4 sccm, respectively, over a period of approximately 24 minutes, thus resulting in a monotonic grade from $Al_{0.8}Ga_{0.2}N$ to GaN (all of the other growth conditions are substantially fixed). The thickness of the graded layer in this exemplary embodiment is approximately 30 nm.

After growth of the graded layer, the TMG flow is cut off and epitaxial growth is stopped. Without wishing to be bound by a particular theory, the growth interruption may allow the surface of the epitaxial graded $Al_xGa_{1-x}N$ layer to equilibrate, thus enhancing island formation in cap layer 360 once growth is reinitiated. The growth interruption may last between approximately 15 seconds and approximately 5 minutes, e.g., approximately 1 minute. During the growth interruption, the ammonia flow is increased from approximately 2 l/min to approximately 8 l/min, the temperature is decreased by approximately 40° C. (e.g., from a growth temperature of approximately 1100° C. for electron-blocking layer 340 to approximately 1060° C.), and the chamber pressure is increased from approximately 20 Torr to approximately 100 Torr. The doping concentration may also be adjusted during the growth interruption. In an embodiment, supply of Mg dopant is increased by increasing hydrogen flow through the Mg-source bubbler from approximately 350 sccm to approximately 500 sccm. After the growth interruption, growth of a cap layer 360 including or consisting essentially of GaN is commenced, and cap layer 360 is grown to a thickness of approximately 200 nm at a rate of approximately 1.5 µm/hr. During growth of an exemplary cap layer 360 formed of GaN, the TMG flow (i.e., the hydrogen flow through the TMG source) is 64 sccm and the V/III ratio is approximately 1200. Cap layer 360 typically forms as a series of islands that coalesce upon further growth, as described below.

As depicted in FIG. 3B, cap layer 360 may be initially formed as a group of islands (e.g., via a Stranski-Krastanov or Volmer-Weber growth mode) that are substantially relaxed. In some embodiments, an islanded cap layer 360 (e.g., a cap layer including or consisting essentially of uncoalesced islands) may be utilized as a contact layer to an underlying device. However, in preferred embodiments, further growth of cap layer 360 results in coalescence of islands into a unified cap layer 360 containing a plurality of defects 370. The defects 370 may include misfit dislocations formed at the bottom interface of cap layer 360 that serve to relax cap layer 360 and also may serve to block propagation of other defects into underlying strained layer(s). However, the array of misfit dislocations may not be an array of screw dislocations characteristic of a twist boundary between wafer-bonded layers. Defects 370 may also include threading dislocations that propagate from the misfit dislocation network through the thickness of cap layer 360. It should be emphasized the defects 370 are only formed in cap layer 360 (and possibly any layers formed thereover), but do not reach underlying layers such as MQW layer 330. Since in most embodiments cap layer 360 merely serves as an electrical contact layer in a subsequently formed device (as detailed below), predominantly only majority carriers are supplied therefrom, a process substantially unaffected by the presence of defects 370. In contrast, minority-carrier diffusion and radiative recombination occurs in active layers such as MQW layer 330, a process quite sensitive to the presence of defects such as threading dislocations. In an embodiment, the defect density (e.g., the threading dislocation density) in cap layer 360 is greater than that in MQW layer 330 and/or substrate 305 by at least two orders of magnitude, at least three orders of magnitude, or even at least five orders of magnitude. In various embodiments, increased V/III ratio, decreased growth temperature, and/or increased chamber pressure (e.g., compared to growth conditions for underlying layers) facilitate the growth of cap layer 360 as a series of islands.

The intentional relaxation of cap layer 360 may enable the utilization of top contact layers more easily doped (and to higher levels) than layers more closely lattice matched to MQW 330 and/or substrate 305. For example, p-type doping of AlN layers (and $Al_xGa_{1-x}N$ layers with large Al concentration x, e.g., x greater than approximately 50%) is often difficult, while GaN layers (and $Al_xGa_{1-x}N$ layers with low Al concentration x) may be p-type doped at high levels relatively easily. For example, a cap layer 360 including or consisting essentially of GaN may be p-type doped such that it has a hole concentration at room temperature ranging between approximately $1\times10^{17}/cm^3$ and approximately $1\times10^{20}/cm^3$, while a cap layer 360 including or consisting essentially of AlN may be p-type doped such that it has a hole concentration at room temperature of less than approximately $1\times10^{12}/cm^3$. The hole concentrations of such doped layers may be less than the physical concentration of dopants, as dopants may not be electrically active in some layers.

Furthermore, the intentional relaxation of cap layer 360 enables formation of thicker contact layers, leading to decreased contact resistance in subsequently fabricated devices. Since cap layer 360 is relaxed, it may be grown to nearly arbitrary thicknesses while leaving the pseudomorphic strain state of underlying layers undisturbed. Also, since maintaining cap layer 360 in a pseudomorphic state increases the strain energy stored in the stack of layers 310-360, the thicknesses of each of these layers may be constrained to prevent lattice relaxation and introduction of defects in the active device layers. Such a constraint may require use of thinner active layers (e.g., MQW layer 330), thus decreasing the potential electrical performance of the device. Since in preferred embodiments cap layer 360 is intentionally relaxed, the strain energy is shared by fewer layers, relaxing thickness constraints for each of layers 310-340.

In a preferred embodiment, PUVLED structure 300 (and/or strained epitaxial layer 220 described above) are formed substantially free (i.e., having less than approximately 1 mm$^{-2}$, or even approximately 0 mm$^{-2}$) of macroscopic defects such as pinholes, mounds, or "V pits." Such defects are often observed in the growth of, e.g., strained InGaN layers on GaN substrates with high dislocation densities. (See T. L. Song, J. Appl. Phys. 98, 084906 (2005), the entire content of which is hereby incorporated by reference). Macroscopic defects may cause local relaxation of the strain in the pseudomorphic layer(s), deleteriously affect devices fabricated from the epitaxial layers due to disruptions of the quantum well structures and/or shorting of the p- and n-type contacts, or increase the surface roughness of the layers. Macroscopic defect-free PUVLED structure 300 may advantageously be utilized in the fabrication of PUVLEDs sized greater than approximately 0.1 mm×approximately 0.1 mm. PUVLED structure 300 has an emission wavelength in the range of approximately 210 nm to approximately 320 nm, e.g., approximately 280 nm. As at least most of the layers in PUVLED structure 300 are pseudomorphic, the threading dislocation density in the layers is less than approximately 10$^5$ cm$^{-2}$, and may be approximately equal to the threading dislocation density in substrate 305. In some embodiments, as detailed above, the threading dislocation of most layers may be approximately equal to that of the substrate and significantly higher in intentionally relaxed cap layers. In an embodiment, PUVLED structure 300 has a wall-plug efficiency (i.e., total optical power out divided by total electrical power in) greater than approximately 10% (or even greater than approximately 20% in some embodiments) and/or a lifetime greater than approximately 10,000 hours.

Laser diode (LD) structures may also benefit from a pseudomorphic structure. A preferred LD structure will be similar to that of PUVLED structure 300, with the addition of layers which properly confine photons to create a resonant cavity. In an edge-emitter LD, the resonant cavity will be directed perpendicular to the growth direction and mirrors will be created by cleaving or etching the semiconductor layer structure. In this case, layer 320 below the MQW layer 330 and layers 340 and 350 above the MQW will need to be modified to act as effective cladding layers to ensure that the emitted photons effectively propagate perpendicular to layer growth direction without significant absorption. For example, one may increase the number of layers schematically labeled as 320, 340 and 350 in FIGS. 3A, 3B, and/or 3C. Alternatively, in a vertical cavity surface-emitting laser ("VCSEL"), layers 320, 340, and 350 may be replaced with multilayer structures that will act as mirrors (e.g., Bragg reflectors) to create a photon cavity that will direct photons along the growth direction of the semiconductor layers. In this way, a semiconductor LD fabricated with nitride semiconductors may have an emission wavelength shorter than approximately 300 nm, and, in some embodiments, shorter than approximately 280 nm.

Figure 4A:
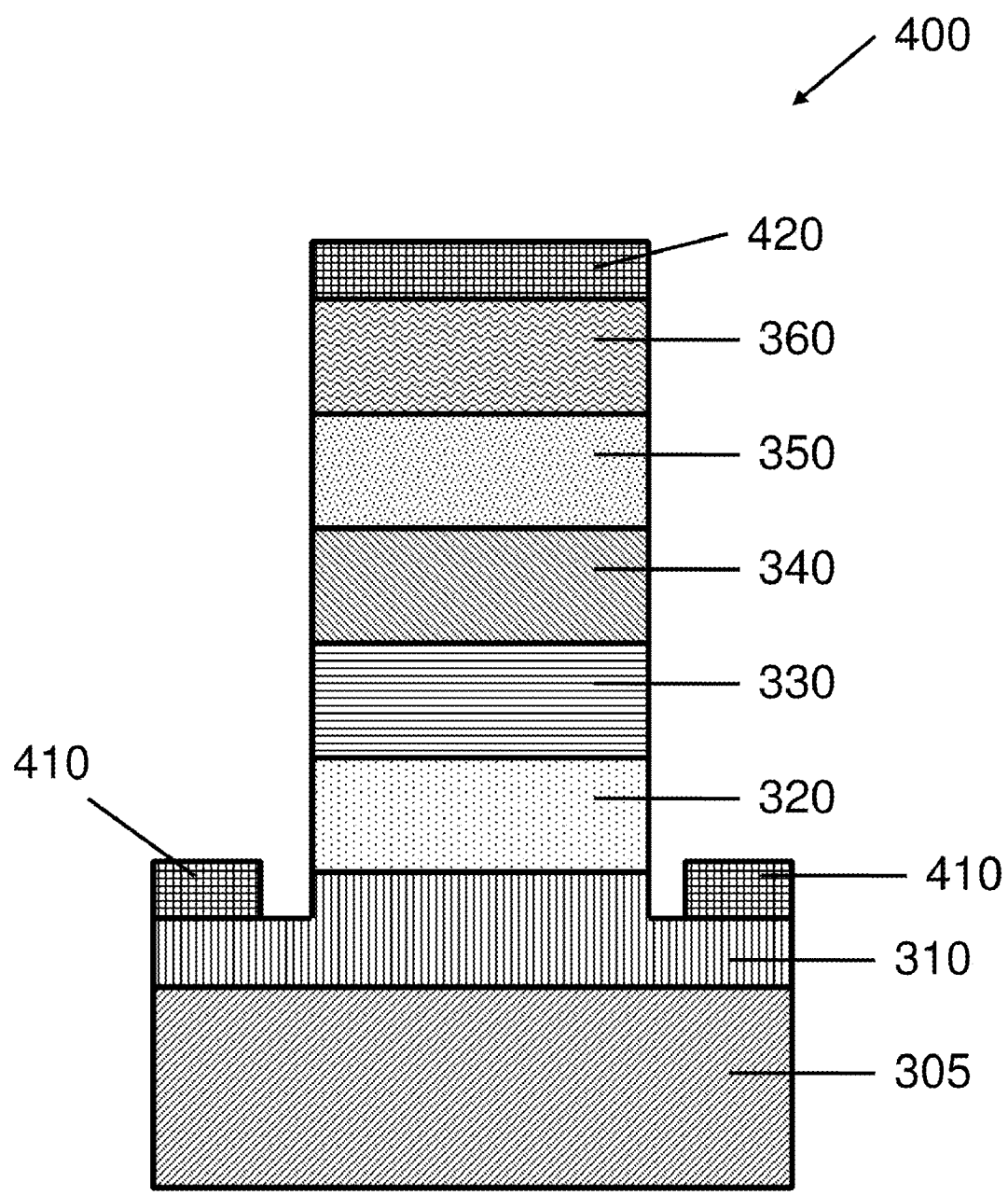
FIGS. 4A, 4B and 4C are schematics of processed devices utilizing the layer structure of FIG. 3A or 3C.
Figure 4B:
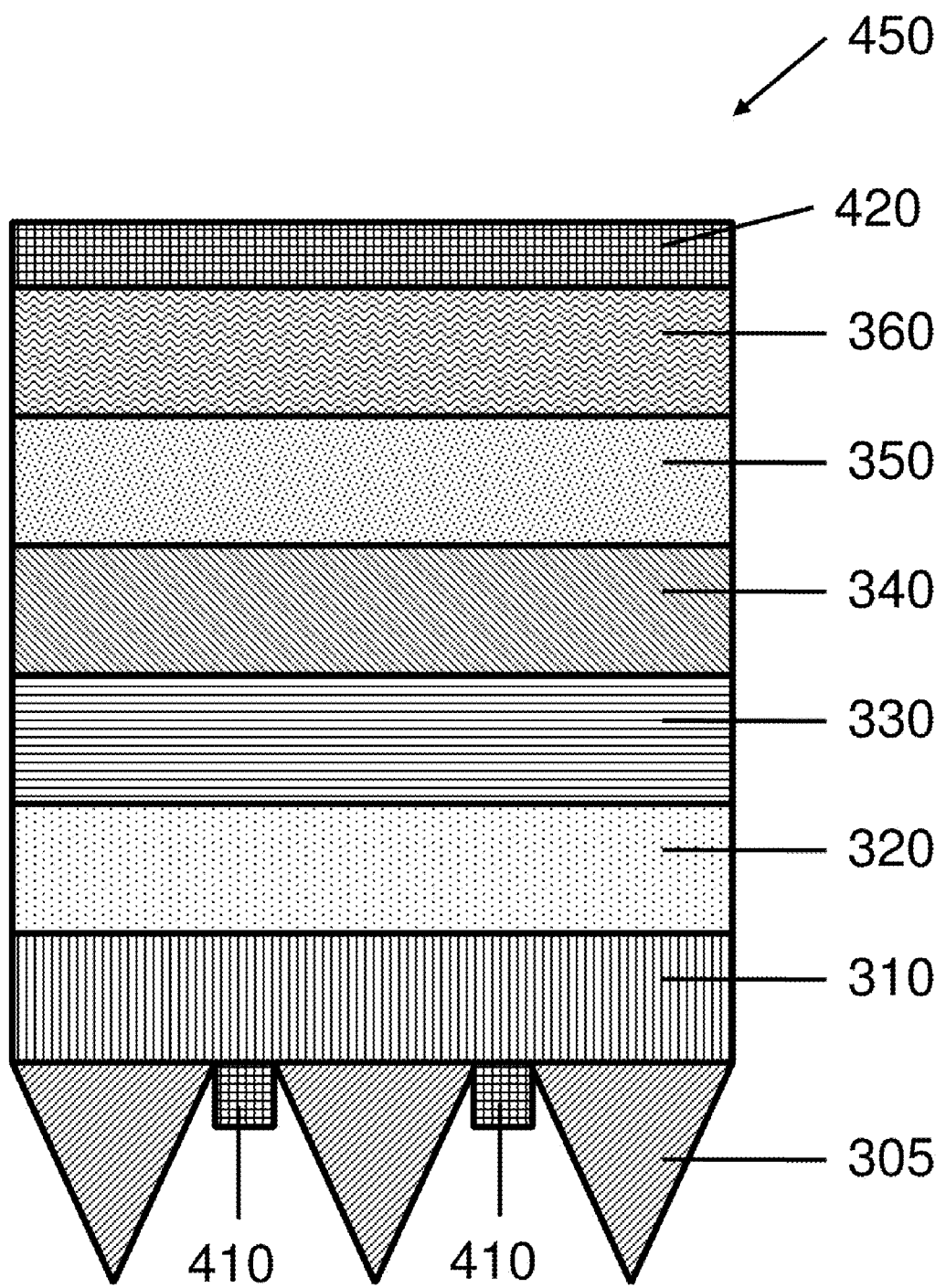

Referring to FIGS. 4A and 4B, different contact schemes may be utilized in conjunction with PUVLED structure 300. PUVLED 400 is formed by etching, e.g., plasma etching, through the layer sequence in PUVLED structure 300 and stopping on or in bottom contact layer 310. Contacts 410, 420 are formed on bottom contact layer 310 and on cap layer 360, respectively. Contacts 410, 420 are formed of a conductive material, e.g., a metal such as Ni/Au alloy (typically used for p-type contacts) or a Ti/Al/Ti/Au stack (typically used for n-type contacts), and may be formed by, e.g., sputtering or evaporation. Contacts 410, 420 may include or consist essentially of the same or different conductive materials (such that optimal contact is made to the oppositely doped bottom contact layer 310 and cap layer 360). Contact 420 may also include an ultraviolet ("UV") reflector. The UV reflector is designed to improve the extraction efficiency of photons created in the active region of the device by redirecting photons which are emitted toward contact 420 (where they cannot escape from the semiconductor layer structure) and redirecting them toward a desired emission surface, e.g., the bottom surface of PUVLEDs 400, 450.

In PUVLED 450, contact 420 is also formed above cap layer 360. However, contact 410 (which may be a plurality of separate contacts), is formed on the backside of the PUVLED active layer structure. In this case, substrate 305 is optionally thinned to approximately 150 μm by, e.g., mechanical grinding or polishing. In other embodiments, the substrate 305 is thinned to approximately 20 μm or even completely removed. A mask layer (not shown), formed of, e.g., Ni, is formed on the backside of substrate 305 and patterned by standard photolithography. The exposed regions of substrate 305 are etched by, e.g., plasma or wet etching, and the etch is stopped on or in bottom contact layer 310. Etch stopping on bottom contact layer 310 is facilitated by detection of Ga in the plasma etcher as substrate 305 will be pure AlN in many embodiments. Contact 410 is then formed on the exposed portions of bottom contact layer 310. Contact 410 may be interdigitated to maximize the light output from PUVLED 450. Importantly, the tapered structures created on the backside of substrate 305 will help gather photons from a much larger emission angle from the MQW structure in layer 340 and direct them out the emission surface near the tips of the taped features shown on the etched backside of the substrate 305 shown in FIG. 4B. This will substantially improve the photon extraction efficiency of the PUVLED since, without the tapered structures, only a small fraction of the photons directed toward a flat emission surface (such as that shown in FIG. 4A) will fall with the critical acceptance cone for emission due to the large index of refraction for these semiconductor materials. For AlN, the acceptance cone is only approximately 25°, which means that approximately 90% of the photons directed toward a flat emission surface (assuming isotropic emission of radiation into the hemisphere directed toward the flat surface) will undergo total internal reflection and be unable to escape from the device and, thus, not be realized as useful emission.

Figure 4C:
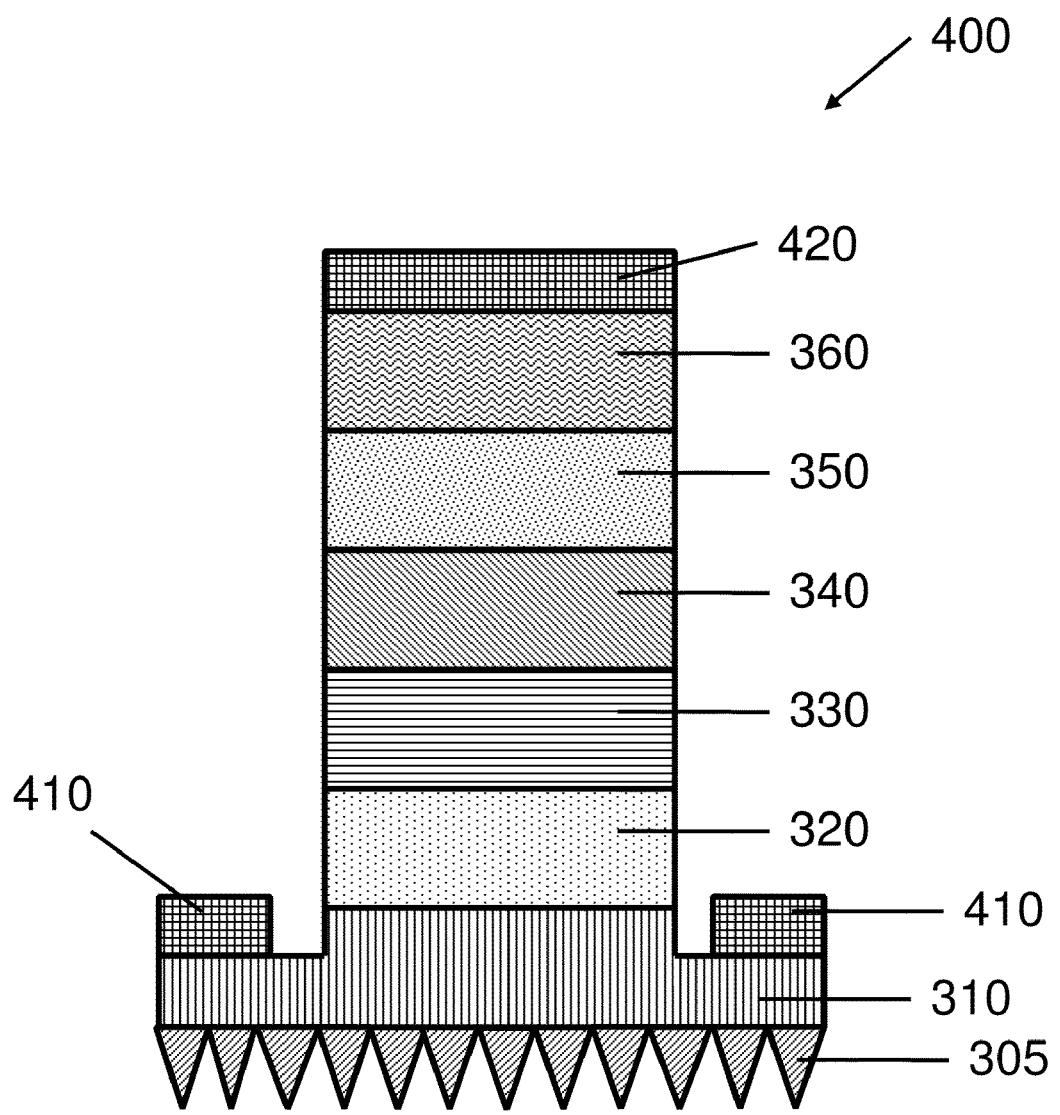

In some embodiments, the photon extraction of PUVLED 400 depicted in FIG. 4A may also be enhanced by patterning the backside of substrate 305, as shown in FIG. 4C. Rather than utilizing a deposited mask for patterning, the backside of substrate 305 may be patterned by exposure to a wet chemical etchant. In some embodiments, substrate 305 is thinned before being patterned. The thinning steps may be omitted in some cases, depending on the absorption coefficient of the substrate 305 and its initial thickness. Photon extraction from PUVLED 400 may be inhibited because photons that reach the outer wall of the substrate 305 have a finite probability of being reflected back inside and then being absorbed. Reducing the thickness of substrate 305 helps to reduce the chances of absorption, but does not reduce the chances of photon reflection at the backside surface. Thus, preferred embodiments of the invention feature patterning the back surface of substrate 305 so that most photons that reach it do so at an angle that is within the corresponding escape cone. In the case of an AlN/air interface, and for a wavelength of 280 nm, the escape cone angle is approximately 25°. In such an embodiment, photons that reach the wall with a trajectory angle smaller than approximately 25°, depending on their wavelengths, will most likely exit the device without being reflected back at the surface. As described herein, a pattern of substantially conical features ("cones") with an apex angle of approximately 26° are formed on the back surface of substrate 305, thus improving photon extraction.

If, for example, substrate 305 has a total thickness variation higher than about 20 μm, then the back surface may be ground, for example, with a 600 to 1800 grit wheel. The removal rate of this step may be purposefully maintained at a low level (approximately 0.3-0.4 μm/s) in order to avoid damaging the substrate 305 or the device structure 400. After the optional grinding step, the back surface may be polished with a polishing slurry, e.g., a solution of equal parts of distilled water and a commercial colloidal suspension of silica in a buffered solution of KOH and water. The removal rate of this step may vary between approximately 10 μm/min and approximately 15 μm/min. Substrate 305 may be thinned down to a thickness of approximately 200 μm to approximately 250 μm, although the scope of the invention is not limited by this range. The thinning step is preferably followed by wafer cleaning in, e.g., one or more organic solvents. In one embodiment of the invention, the cleaning step includes immersion of substrate 305 in boiling acetone for approximately 10 minutes, followed by immersion in boiling methanol for approximately 10 minutes.

Once substrate 305 is cleaned, the backside thereof is patterned by etching in a suitable solution (e.g., a basic solution such as KOH in deionized (DI) water). In another embodiment of the invention, the etching agent is a solution of NaOH in DI water. The molarity of the basic solution may vary between approximately 1M and approximately 20M, and the etching time may vary between approximately 1 minute and approximately 60 minutes. The temperature of the etching solution may vary between approximately room temperature up to approximately 100° C. Similar results may be obtained when using a higher molarity solution for shorter periods of time and vice versa. In one embodiment of the invention, substrate 305 is etched in a 4M solution of KOH and DI water for 8 minutes while maintaining the solution at approximately 20° C. According to another aspect of this invention, the patterned "cones" begin developing on the back surface of substrate 305 that was not polished with a polishing slurry when etched in a molten 20M KOH bath at 100° C. for approximately one hour.

Table 1 shows the percentage increase in the output power delivered by PUVLED 400 after the back surface of substrate 305 was etched at room temperature with solutions of different concentrations of KOH.

| Time (min) | 0.1 M | 1 M | 4 M |
| --- | --- | --- | --- |
| 1 | 12% | 20% | 22% |
| 2 | | 31% | 24% |
| 4 | | 29% | 18% |
| 10 | 20% | | |
| 30 | 23% | 35% | 31% |

In another embodiment, the output power of PUVLED 400 fabricated on an AlN substrate 305 increased by up to 78% after the N-surface of the substrate was etched in a 4M solution of KOH and DI water for approximately 8 minutes while maintaining the solution at approximately 20° C.

The etched surface of substrate 305 may also improve the directionality of the light that is emitted by PUVLED 400. In particular, it is often desirable to have the emitted light focused in a forward direction rather than in the typical, more broadly distributed Lambertian output through a smooth semiconductor surface. The photons in the escape cone emitted through a smooth semiconductor will be refracted and distributed relatively uniformly throughout the half sphere corresponding to the area above the surface of the semiconductor. The number of photons emitted at large angles (from the surface normal) is slightly lower due to the higher probability of reflection at the interface, and drops to approximately 50% of the peak intensity at an angle of approximately 84° from the surface normal in many embodiments featuring unpatterned substrates 305. For the etched surface however, the light is much more focused towards the surface normal, with the intensity falling to approximately 50% of the peak intensity at an angle of only approximately 30° from the surface normal in many embodiments, thus enabling much higher power densities.

EXAMPLE

A device structure including an $Al_{0.7}Ga_{0.3}N:Si$ layer, a five-period MQW layer consisting of n—$Al_{0.7}Ga_{0.3}N$ barriers and $Al_{0.55}Ga_{0.45}N$ wells, a $Al_{0.8}Ga_{0.2}N$ electron blocking layer (EBL), and a p—GaN contact layer was grown on a c-plane AlN substrate using conventional MOCVD. UVLEDs were fabricated using standard LED processing techniques. A circular mesa with a 360 μm diameter was defined by inductively coupled plasma (ICP) etching. A Ti/Al/Ti/Au layer was used for the n-contact and a Ni/Au layer was used for the p-contact. Following device fabrication, the substrate was thinned to a thickness of approximately 200 μm, and the backside was roughened for improved light extraction (as detailed above). Light output was measured on-wafer through the partially absorbing AlN substrate using a calibrated spectrometer and fiber optic probe.

Cross-sectional transmission electron microscopy confirmed that the dislocation density in the $nAl_{0.7}Ga_{0.3}N$ layer was quite low with no dislocations in the field of view. The low dislocation density continues through the MQW and EBL. However, the lattice mismatch between the pseudomorphic $Al_xGa_{1-x}N$ layers and the p—GaN contact layer is high (approximately 2.4%), and the contact layer at least initially forms in a Stranski-Krastanov or Volmer-Weber growth mode. Thus, the cap layer initially forms as a series of islands which only coalesce once the film thickness is increased to around 0.2 μm, resulting in a high density of threading dislocations through the layer and misfit dislocations, which relieve strain, at its bottom interface. The threading dislocations do not propagate into the active region and thus enable the achievement of high internal and external quantum efficiencies from the devices having low-dislocation-density pseudomorphic active layers.

Pulsed operation of a PUVLED emitting at 248 nm gave a peak external quantum efficiency (EQE) of 1.44% with an output power of 1.44 mW and a peak power of 16.3 mW with an EQE of 1.09%. When operated in continuous-wave mode, a 243 nm device reached a peak EQE of 0.73% and an output power of 1 mW at 25 mA, even with some self-heating. The same device was able to achieve 14.6 mW and an EQE of 0.72% at 400 mA when operated at low duty cycles in pulsed mode. Other devices across several substrates, different epitaxy runs, and process lots exhibited similar good performance with averages of 1.1 mW from 240 to 250 nm and 2.5 mW from 250 to 260 nm with devices over 5 mW in both ranges. These results are a direct consequence of the low dislocation density in the active region due to the pseudomorphic growth and represent significant improvements in the performance of short-wavelength LEDs.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A semiconductor device comprising:
    an aluminum nitride single-crystal substrate;
    at least one pseudomorphic strained layer disposed thereover, the strained layer comprising at least one of AlN, GaN, InN, or an alloy thereof; and
    disposed over the at least one strained layer, a semiconductor layer that is lattice-mismatched to the substrate and substantially relaxed.
2. The semiconductor device of claim 1, wherein the relaxed semiconductor layer comprises a plurality of defects, the defects not propagating into the at least one strained layer.
3. The semiconductor device of claim 1, further comprising a metal contact layer disposed over the relaxed semiconductor layer.
4. The semiconductor device of claim 1, wherein the relaxed semiconductor layer comprises p-type-doped gallium nitride.
5. The semiconductor device of claim 1, wherein the relaxed semiconductor layer is p-type doped to a hole concentration at room temperature ranging between approximately $1\times10^{17}/cm^3$ and approximately $1\times10^{20}/cm^3$.
6. The semiconductor device of claim 1, further comprising, disposed on a bottom surface of the substrate, a pattern comprising a plurality of cones.
7. The semiconductor device of claim 6, wherein each of the plurality of cones has an apex angle of approximately 26°.
8. The semiconductor device of claim 1, wherein a defect density of the relaxed semiconductor layer is at least two orders of magnitude larger than a defect density of the substrate.
9. A method of forming a semiconductor device, the method comprising:
    forming, over a single-crystal substrate, at least one pseudomorphic strained layer comprising at least one of AlN, GaN, InN, or an alloy thereof; and
    forming, over the at least one strained layer, a semiconductor layer that is lattice-mismatched to the substrate and substantially relaxed without (i) relaxing the at least one strained layer, and (ii) propagation of defects from the semiconductor layer into the at least one strained layer.
10. The method of claim 9, further comprising forming a metal contact layer over the relaxed semiconductor layer.
11. The method of claim 9, wherein the substrate comprises aluminum nitride and the relaxed semiconductor layer comprises gallium nitride.
12. The method of claim 9, wherein forming the relaxed semiconductor layer comprises forming at least a portion of the relaxed semiconductor layer as a series of islands.
13. The method of claim 9, wherein the at least one strained layer and the relaxed semiconductor layer are both formed by epitaxial deposition.
14. The method of claim 9, further comprising forming a pattern of cones on a back surface of the substrate.
15. The method of claim 14, wherein the pattern is formed by etching.
16. The method of claim 9, further comprising removing at least a portion of the substrate.
17. The semiconductor device of claim 1, wherein the relaxed semiconductor layer consists essentially of doped or undoped GaN.
18. The method of claim 9, wherein the relaxed semiconductor layer consists essentially of doped or undoped GaN.
19. The semiconductor device of claim 1, further comprising an array of misfit dislocations at an interface between the relaxed semiconductor layer and a layer disposed beneath and in direct contact with the relaxed semiconductor layer.
20. The method of claim 9, wherein forming the relaxed semiconductor layer comprises forming an array of misfit dislocations at an interface between the relaxed semiconductor layer and a layer disposed beneath and in direct contact with the relaxed semiconductor layer.

* * * * *